(12) United States Patent
Taussig et al.

(10) Patent No.: US 10,571,804 B2
(45) Date of Patent: Feb. 25, 2020

(54) METHOD OF FABRICATING A COLOR FILTER ARRAY USING A MULTILEVEL STRUCTURE

(71) Applicant: Applied Materials, Inc., Santa Clara, CA (US)

(72) Inventors: Carl P. Taussig, Redwood City, CA (US); Edward Robert Holland, Portola Valley, CA (US); Ping Mei, San Jose, CA (US); Richard E. Elder, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 168 days.

(21) Appl. No.: 15/382,993

(22) Filed: Dec. 19, 2016

(65) Prior Publication Data

US 2017/0102611 A1 Apr. 13, 2017

Related U.S. Application Data

(62) Division of application No. 14/355,507, filed as application No. PCT/US2011/058617 on Oct. 31, 2011, now Pat. No. 9,535,315.

(51) Int. Cl.
*G03F 7/00* (2006.01)
*G02B 5/22* (2006.01)
(Continued)

(52) U.S. Cl.
CPC ........ *G03F 7/0007* (2013.01); *B29D 11/0073* (2013.01); *B29D 11/00634* (2013.01);
(Continued)

(58) Field of Classification Search
CPC ............ G03F 7/0007; B29D 11/00634; B29D 11/0073; G02B 5/201; G02B 5/208;
(Continued)

(56) References Cited

U.S. PATENT DOCUMENTS 5,925,484 A 7/1999 Shima et al.
6,285,065 B1 9/2001 Levy
(Continued)

FOREIGN PATENT DOCUMENTS

JP 05-257008 10/1993

OTHER PUBLICATIONS

Carrier, et al.; CERIAS, Purdue Univeristy; Symposium 2004 Posters—Center for Education and Research in Information Assurance and Security; http://www.cerias.purdue.edu/news_and_events/events/symposium/2004/posters/; 2004.
(Continued)

*Primary Examiner* — Wen Huang
(74) *Attorney, Agent, or Firm* — Patterson + Sheridan, LLP

(57) ABSTRACT

A method of fabricating a color filter array including providing substrate, forming a multilevel structure that is attached to the substrate, etching the multilevel structure to expose first wells in the multilevel structure, filling at least the first wells in the multilevel structure with the first color component, curing the first color component, etching the multilevel structure to expose second wells in the multilevel structure, filling at least the second wells in the multilevel structure with a second color component, and curing the second color component.

15 Claims, 22 Drawing Sheets

(51) Int. Cl.
| | |
|---|---|
| *G02F 1/1335* | (2006.01) |
| *H01L 27/146* | (2006.01) |
| *B29D 11/00* | (2006.01) |
| *G02B 5/20* | (2006.01) |
| *G03C 7/12* | (2006.01) |
| *G02F 1/13* | (2006.01) |

(52) U.S. Cl.
CPC .............. *G02B 5/201* (2013.01); *G02B 5/208* (2013.01); *G02B 5/223* (2013.01); *G02F 1/133509* (2013.01); *G02F 1/133516* (2013.01); *G03C 7/12* (2013.01); *G03F 7/0002* (2013.01); *H01L 27/14621* (2013.01); *H01L 27/14685* (2013.01); *G02F 1/1303* (2013.01)

(58) Field of Classification Search
CPC .............. G02B 5/223; G02F 1/133509; G02F 1/133516; G02F 1/1303; G03C 7/12; H01L 27/14685; H01L 27/14621
USPC ........................................................ 359/891
See application file for complete search history.

(56) References Cited

U.S. PATENT DOCUMENTS

| | | | |
|---|---|---|---|
| 2002/0126249 | A1 | 9/2002 | Liang et al. |
| 2004/0058063 | A1 | 3/2004 | Okada et al. |
| 2004/0229140 | A1 | 11/2004 | Kim |
| 2005/0157157 | A1* | 7/2005 | Tsukamoto ............ B41M 5/265 347/213 |
| 2006/0132897 | A1 | 6/2006 | Chen et al. |
| 2010/0165273 | A1* | 7/2010 | Cheng .................... G02B 5/201 349/106 |
| 2010/0178832 | A1 | 7/2010 | Liu et al. |
| 2011/0242444 | A1* | 10/2011 | Song .................... G06F 3/0412 349/43 |

OTHER PUBLICATIONS

Collberg, et al.; Dynamic Path-Based Software Watermarking; Department of Computer Science, University of Arizona; PLDI'04, Jun. 9-11, 2004, Washington, DC, USA. Copyright 2004 ACM 1-58113-807-5/04/0006.

Collberg, et al.; Software Watermarking Models and Dynamic Embeddings; Department of Computer Science, The University of Auckland, Auckland, New Zealand; POPL 99 San Antonio, Texas, USA. Copyright ACM 1999 1-581 13-095-3/99/01.

Kaplan, et al.; Multilayer Pattern Transfer for Plasmonic Color Filter Applications; Center for Nanophotonics and Spintronics, Department of Electrical Engineering and Computer Science, University of Michigan, 1301 Beal Avenue, Ann Arbor, Michigan 48109; Published Dec. 2, 2010; 2010 American Vacuum Society.

Koo, et al.; Physical Chromaticity of Colorant Resist of Color Filter Prepared by Inkjet Printing Technology; Applied Physics Letters 88, 111908; published online Mar. 15, 2006; 2006 American Institute of Physics; Downloaded Dec. 14, 2010 to 15.243.233.68.

Lu, et al.; Ring-Edged Bank Array Made by Inkjet Printing for Color Fillers; Journal of Display Technology, vol. 5, No. 5, May 2009; 2009 IEEE.

Nishii, et al.; P-165; Novel Type of Flexible and Full Color Electronic Paper Displays Using Quick-Response Liquid Powder Technology; Bridgestone Corporation, 3-1-1 Ogawahigashi-cho, Kodaira-shi, Tokyo, Japan; Reiji Hattori; Department of Electronics, Kyushu University, 6-10-1 Hakozaki, Higashi-ku, Fukuoka, Japan; ISSN/008-0966X/08/3903-1819; 2008 SID.

Topkara, et al.; Natural Language Watermarking; Security, Steganography, and Watermarking Multimedia Contents VII, edited by Edward J. Delp III, Ping Wah Wong, Proc. of SPIE IS&T Electronic Imaging, SPIE vol. 5681; 2005.

\* cited by examiner

METHOD OF FABRICATING A COLOR FILTER ARRAY USING A MULTILEVEL STRUCTURE

CROSS-REFERENCE TO RELATED APPLICATIONS

This application is a divisional application of co-pending U.S. patent application Ser. No. 14/355,507, filed on Apr. 30, 2014, which claims priority to International Application No. PCT/US2011/058617, filed on Oct. 31, 2011. Each of aforementioned patent applications are incorporated herein by reference.

BACKGROUND OF THE INVENTION

Color filter arrays are used in a variety of electronic devices, including portable devices, such as laptop computers, and non-portable devices, such as flat screen televisions. Color filter arrays can be used to filter light that is later captured by a sensing element, such as in a digital camera, or to provide color in a flat panel display. Color filter arrays are used in display technologies, such as liquid crystal display (LCD) and organic light emitting diode (OLED) display technologies.

Typically, a color filter array includes many pixels and each pixel includes a number of colored sub-pixels that are separated from one another by a narrow black matrix. Each sub-pixel is a single color, such as red, green, blue, white, cyan, yellow, magenta, or another suitable color. Light is passed through a sub-pixel to display the sub-pixel's color. A different amount of light is passed through different sub-pixels to provide a large number of colors.

Often, color filter arrays are manufactured using photolithography on glass. Photosensitive colored dyes are applied to a sheet of glass and selectively exposed or cured and washed off to create the narrow black matrix and the sub-pixels. However, this requires a large number of steps and is cost prohibitive.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that features of the various embodiments described herein may be combined with each other, unless specifically noted otherwise.

Figure 1:
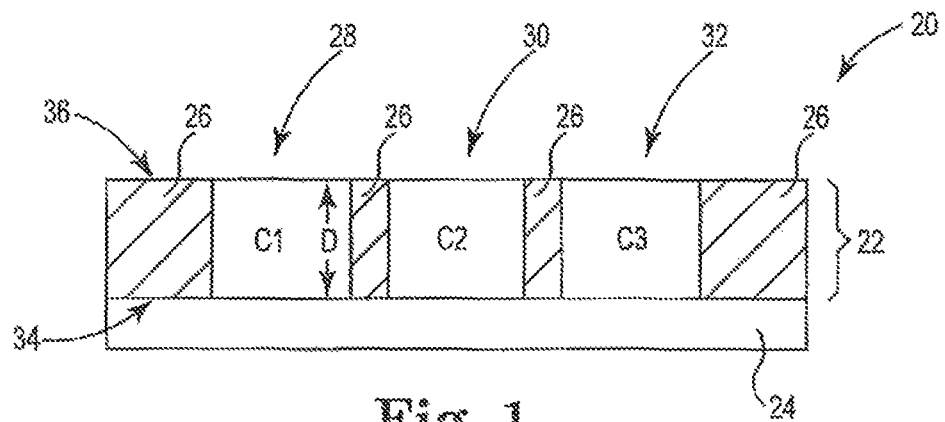
FIG. 1 is a diagram illustrating one embodiment of a color filter array having three colors.

FIG. 1 is a diagram illustrating one embodiment of a color filter array 20 having three colors. In other embodiments, color filter array 20 can have a different number of colors, such as two colors or more than three colors.

Color filter array 20 includes a well structure 22 and a substrate structure 24. Well structure 22 includes ribs 26 that define color wells 28, 30, and 32 in well structure 22. The ribs 26 are the side walls of color wells 28, 30, and 32 and substrate structure 24 is the floor of each of the color wells 28, 30, and 32. Well structure 22, including ribs 26, has a bottom side 34 and a top side 36. The bottom side 34 of well structure 22, which is the bottom side 34 of each of the ribs 26, is attached to substrate structure 24. The top side 36 of well structure 22, which is the top side 36 of each of the ribs 26, is unattached. Also, the top side 36 of each of the ribs 26 is planar. Each of the color wells 28, 30, and 32 is rectangular and has a depth D. In one embodiment, color filter array 20 includes color wells, such as color wells 28, 30, and 32, in a matrix of color wells. In one embodiment, color filter array 20 includes color wells, such as color wells 28, 30, and 32, in a matrix of color wells, where each of the color wells is a sub-pixel and a group of color wells make-up a pixel in a display. In other embodiments, color wells 28, 30, and 32 are a different shape, such as oblong.

Color wells 28, 30, and 32 are filled with color components, such as color dyes that are cured. Each of the color wells 28, 30, and 32 is filled with a single color, such as red, green, blue, white, cyan, yellow, magenta, or another suitable color. First color well 28 is filled with a first color C1, second color well 30 is filled with a second color C2, and third color well 32 is filled with a third color C3. The color component in each of the color wells 28, 30, and 32 is planar with the top side 36 of the ribs 26. Light is passed through one of the color wells 28, 30, and 32 to display the selected color. In other embodiments, the color component in each of the color wells 28, 30, and 32 is below and not planar with the top side 36 of the ribs 26.

In one embodiment, well structure 22 provides a black matrix between color wells 28, 30, and 32. In one embodiment, an opaque layer or black layer is applied between well structure 22 and substrate structure 24 and the opaque layer is visible through ribs 26 in well structure 22 to provide a black matrix between color wells 28, 30, and 32.

Color filter array 20 is manufactured in a roll-to-roll process that reduces cost and provides high resolution and high speed manufacturability. Color filter array 20 can be used in display technologies, such as LCD, OLED, and electrophoretic display technologies. In one embodiment, each rectangular color well is about 100 microns in length and 100 microns in width and each of the ribs 26 is about 10 microns wide. In one embodiment, the roll-to-roll process uses rolls that are greater than 3 meters wide.

Methods of manufacturing a color filter array, such as color filter array 20 of FIG. 1, include forming a multilevel structure that has different lateral patterns at different depths or vertical heights in a three dimensional structure. The multilevel structure is sequentially etched in the vertical direction to reveal previously covered color wells. The exposed color wells are filled with a color component that is cured. In one embodiment, the multilevel structure is a high resolution multilevel polymer structure.

Figure 2A:
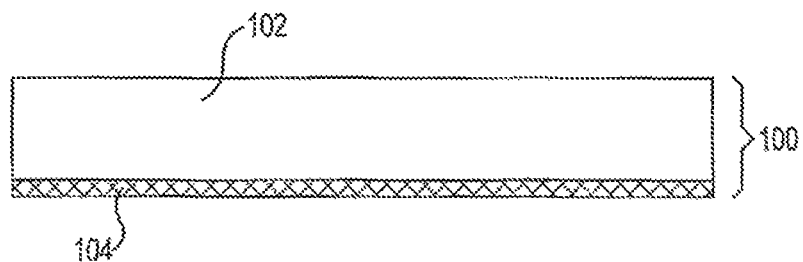
FIGS. 2A-2P are diagrams illustrating a first method of manufacturing a color filter array.
Figure 2B:
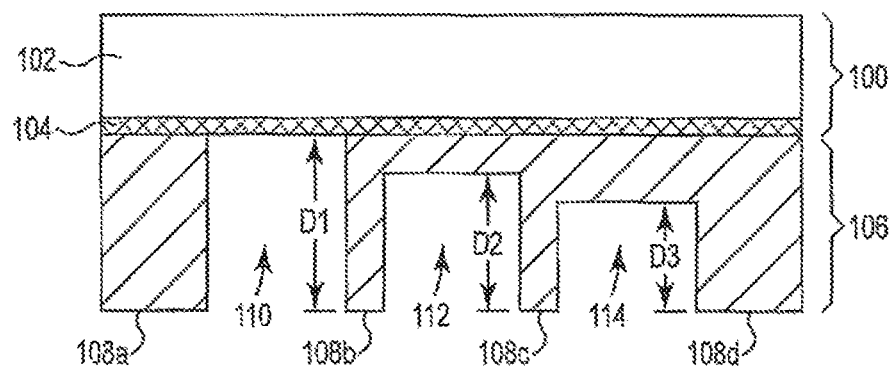
Figure 2C:
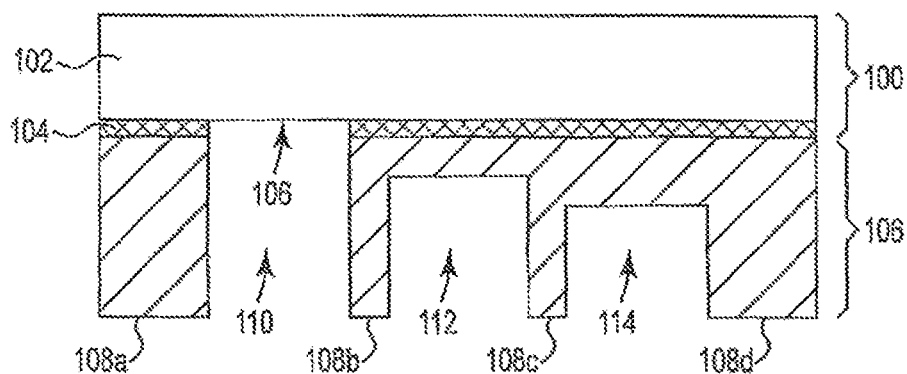
Figure 2D:
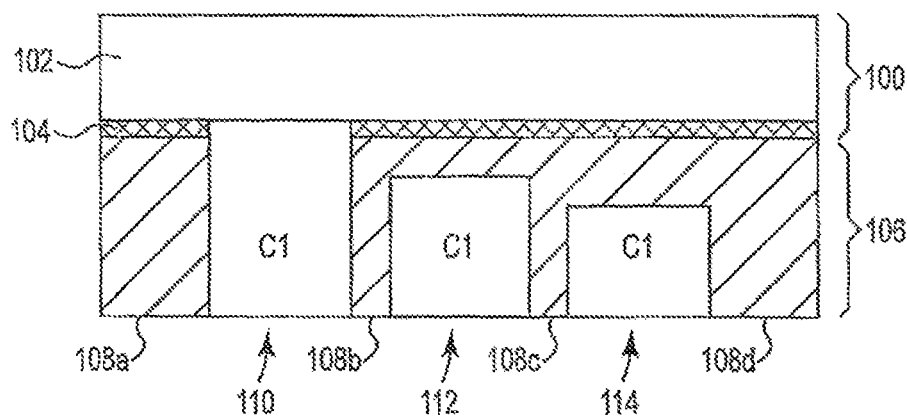
Figure 2E:
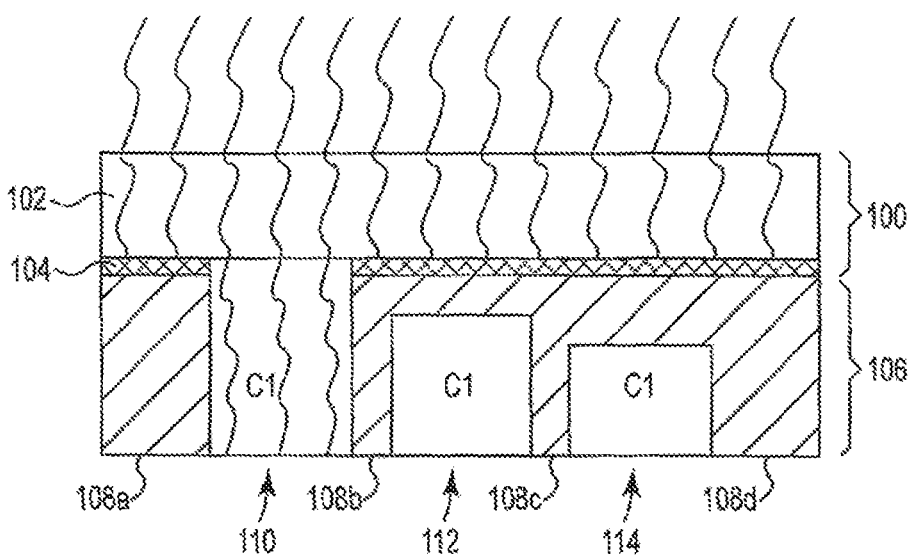
Figure 2F:
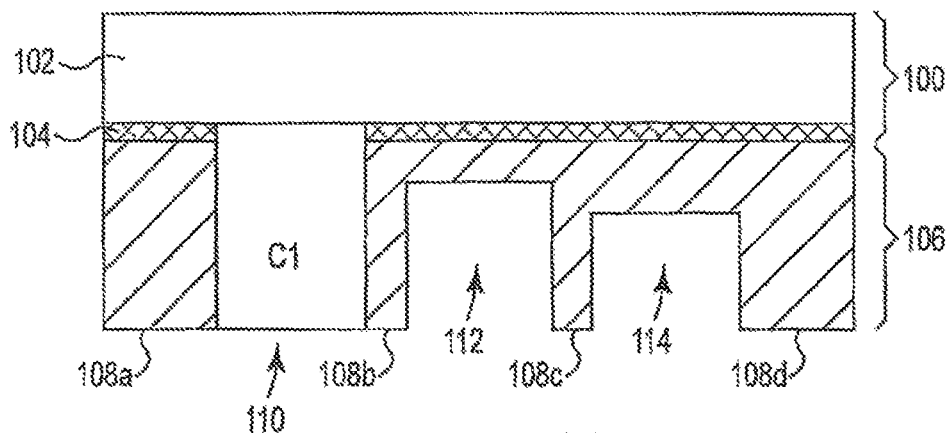
Figure 2G:
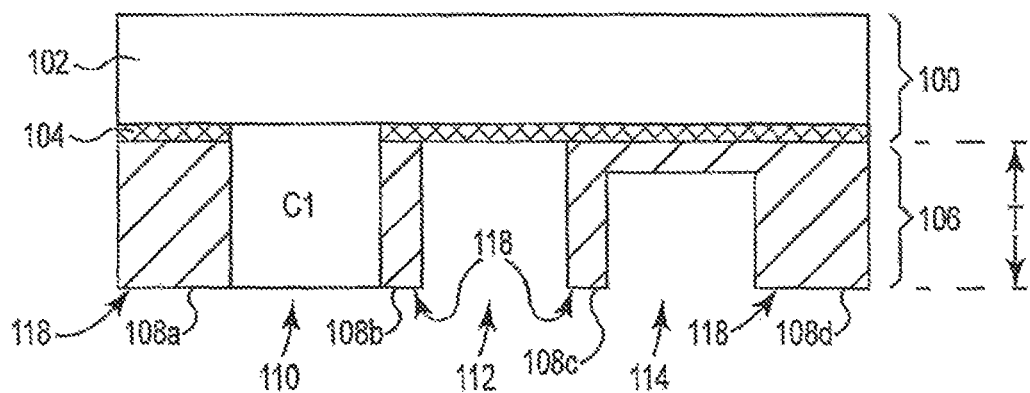
Figure 2H:
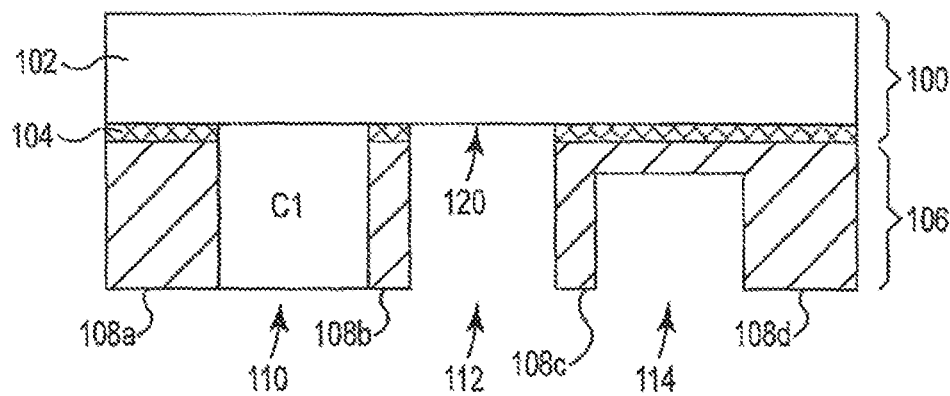
Figure 2I:
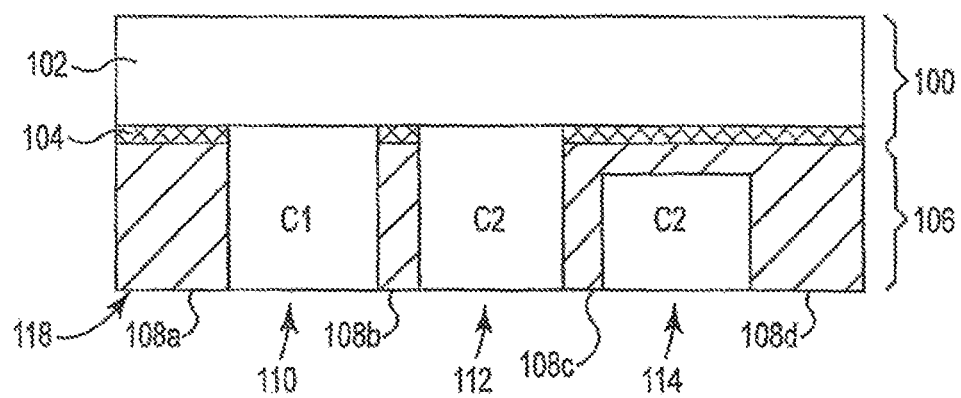
Figure 2J:
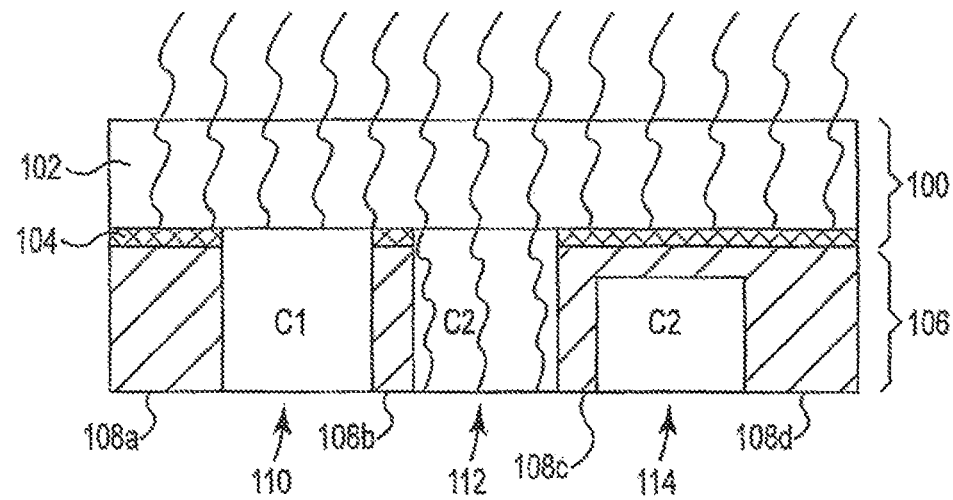
Figure 2K:
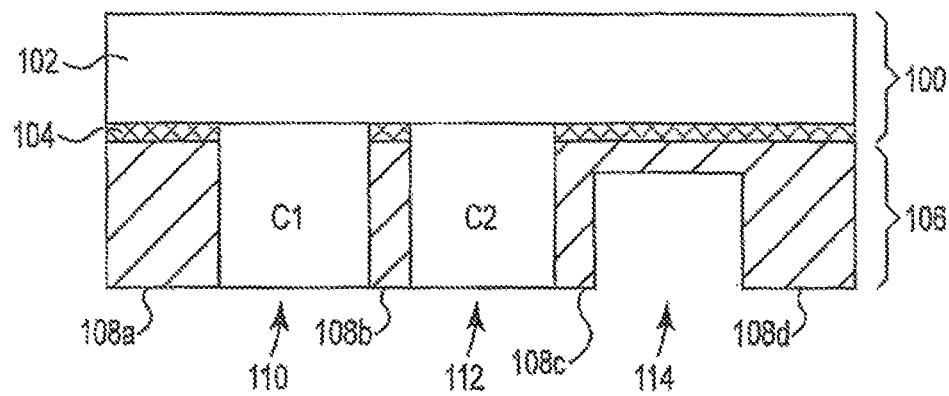
Figure 2L:
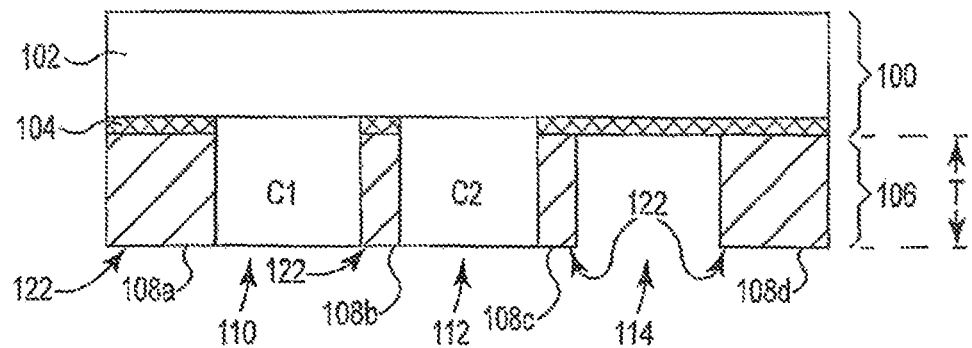
Figure 2M:
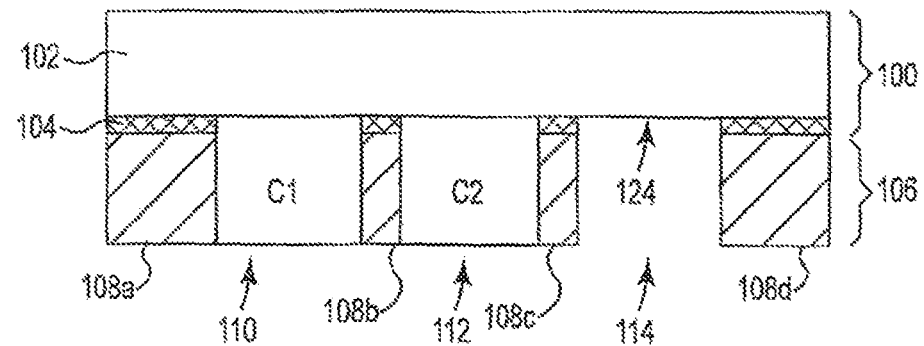
Figure 2N:
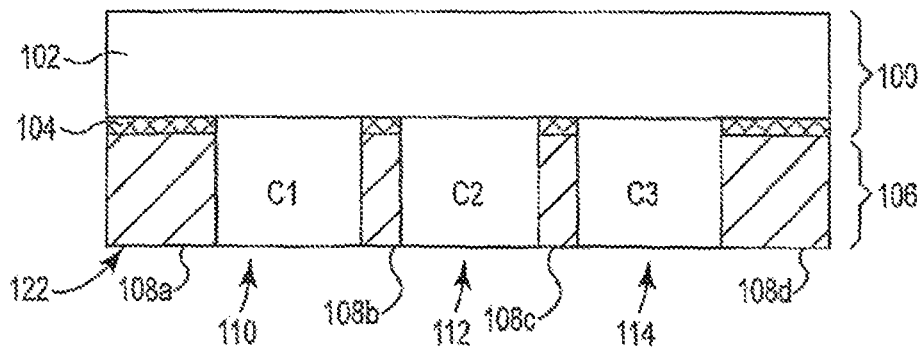
Figure 2O:
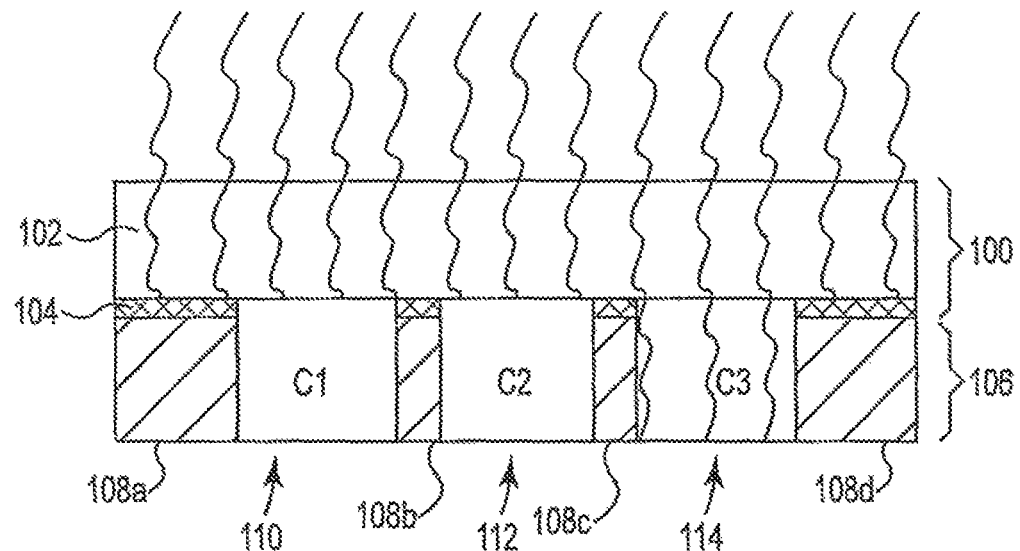
Figure 2P:
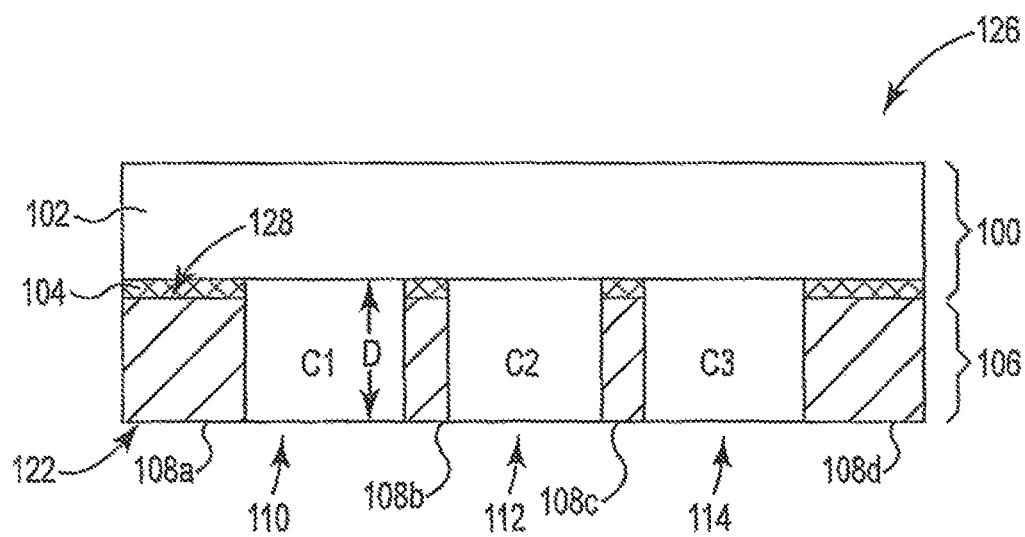

FIGS. 2A-2P are diagrams illustrating a first method of manufacturing a color filter array similar to color filter array 20 of FIG. 1.

FIG. 2A is a diagram illustrating one embodiment of a substrate structure 100. In one embodiment, substrate structure 100 is similar to substrate structure 24 (shown in FIG. 1).

Substrate structure 100 includes a substrate 102 and a blocking layer 104. Blocking layer 104 is applied to one side of substrate 102. In one embodiment, blocking layer 104 is deposited on substrate 102.

Substrate 102 is transparent to at least ultraviolet light and blocking layer 104 is substantially opaque to ultraviolet light. Blocking layer 104 provides the black matrix. In one embodiment, substrate 102 is a polymer substrate. In one embodiment, blocking layer 104 includes metal. In one embodiment, blocking layer 104 includes a polymer including carbon black. In one embodiment, blocking layer 104 includes an oxide that scatters light. In one embodiment, blocking layer 104 includes multiple layers of material.

FIG. 2B is a diagram illustrating one embodiment of a multilevel structure 106 formed on blocking layer 104. Multilevel structure 106 is a flexible multilevel structure. In one embodiment, multilevel structure 106 is a polymer.

Multilevel structure 106 has different lateral patterns at different depths or vertical heights. Multilevel structure 106 includes ribs 108a-108d that define color wells 110, 112, and 114. In one embodiment, multilevel structure 106 is similar to well structure 22 (shown in FIG. 1). In one embodiment, ribs 108a-108d are similar to ribs 26 (shown in FIG. 1). In one embodiment, color wells 110, 112, and 114 are similar to color wells 28, 30, and 32 (shown in FIG. 1).

Each of the color wells 110, 112, and 114 has a different depth. Color well 110 has depth D1, color well 112 has depth D2, and color well 114 has depth D3. The differences in depths D1-D3 between color wells 110, 112, and 114 are exaggerated to illustrate the process. In one embodiment, each of the color wells 110, 112, and 114 is on the order of 5-10 microns deep and the differences in depths D1-D3 are on the order of 100's of nanometers.

Multilevel structure 106 is imprinted on blocking layer 104 in a roll-to-roll process that includes a flexible press. In this process, a thin layer of liquid polymer is coated onto blocking layer 104. Next, a stamp having a three dimensional structure corresponding to multilevel structure 106 is pressed into the liquid polymer. The liquid polymer is then cured, such as by shining an ultraviolet light onto the polymer to fix the polymer. In one embodiment, the liquid polymer is applied in a reverse gravure process. In one embodiment, the liquid polymer is applied in a slot-die process. In other embodiments, a different process is used to form multilevel structure 106 on blocking layer 104.

FIG. 2C is a diagram illustrating one embodiment of blocking layer 104 etched away in color well 110. During this etch, any residual layer or residual material of multilevel structure 106 in color well 110 is etched away and blocking layer 104 in color well 110 is etched away to expose substrate 102. After this etch, the floor 116 of color well 110 is substrate 102. In one embodiment, this etch is a dry etch. In one embodiment, this etch is a plasma dry etch. In one embodiment, this etch includes at least one of fluorine gas and oxygen. Next, color wells 110, 112, and 114 are filled with the first color component C1.

FIG. 2D is a diagram illustrating one embodiment of color wells 110, 112, and 114 filled with a first color component C1. The first color component C1 is a single color, such as red, green, blue, white, cyan, yellow, magenta, or another suitable color. As color wells 110, 112, and 114 are filled, a slight underfill or a doctor blade may be used to avoid smearing across the top of multilevel structure 106. In one embodiment, the first color component C1 is applied in a slot-die process. In one embodiment, the first color component C1 is applied in a gravure process. In one embodiment, the first color component C1 is a negative tone color filter dye.

FIG. 2E is a diagram illustrating the first color component C1 in color well 110 being cured. An ultraviolet light is applied through substrate 100 and into first color component C1 in color well 110. This cures the first color component C1 in color well 110. Blocking layer 104 blocks the ultraviolet light and prevents the ultraviolet light from curing the first color component C1 in color wells 112 and 114.

FIG. 2F is a diagram illustrating one embodiment of the first color component C1 washed out of color wells 112 and 114. In this wash, the cured first color component C1 in color well 110 does not wash out of color well 110. In contrast, the uncured first color component C1 in color wells 112 and 114 washes out of color wells 112 and 114.

FIG. 2G is a diagram illustrating one embodiment of first color component C1 and multilevel structure 106 after multilevel structure 106 in color well 112 has been etched away to expose blocking layer 104. Multilevel structure 106 is etched away in color wells 112 and 114 and at the tops 118 of ribs 108a-108d to reduce the thickness T of multilevel structure 106. First color component C1 and the tops 118 of ribs 108a-108d are substantially planar. In one embodiment, this etch is a dry etch. In one embodiment, this etch is a plasma dry etch. In one embodiment, this etch includes at least one of fluorine gas and oxygen. In other embodiments, first color component C1 etches faster than multilevel structure 106, such that first color component C1 is recessed in color well 110 with respect to the tops 118 of ribs 108a-108d.

FIG. 2H is a diagram illustrating one embodiment of blocking layer 104 etched away in color well 112. During this etch, any residual layer or residual material of multilevel structure 106 in color well 112 is etched away and blocking layer 104 in color well 112 is etched away to expose substrate 102. After this etch, the floor 120 of color well 112 is substrate 102. In one embodiment, this etch is a dry etch. In one embodiment, this etch is a plasma dry etch. In one embodiment, this etch includes at least one of fluorine gas and oxygen. Next, color wells 112 and 114 are filled with the second color component C2.

FIG. 2I is a diagram illustrating one embodiment of color wells 112 and 114 filled with a second color component C2 that is different than the first color component C1. The second color component C2 is a single color, such as red, green, blue, white, cyan, yellow, magenta, or another suitable color. As color wells 112 and 114 are filled, a slight underfill or doctor blade may be used to avoid smearing across the top 118 of multilevel structure 106. In one embodiment, the second color component C2 is applied in a slot-die process. In one embodiment, the second color component C2 is applied in a gravure process. In one embodiment, the second color component C2 is a negative tone color filter dye.

FIG. 2J is a diagram illustrating the second color component C2 in color well 112 being cured. An ultraviolet light is applied through substrate 100 and into second color component C2 in color well 112. This cures the second color component C2 in color well 112. Blocking layer 104 blocks the ultraviolet light and prevents the ultraviolet light from curing the second color component C2 in color well 114.

In one embodiment, cured first color component C1 blocks the ultraviolet light and prevents any residual second color component C2 on the first color component C1 from being cured. In other embodiments, cured first color component C1 does not block the ultraviolet light and care is taken to prevent residual second color component C2 from being on cured first color component C1 is or it is removed prior to or after curing.

FIG. 2K is a diagram illustrating one embodiment of the second color component C2 washed out of color well 114. In this wash, the cured first color component C1 in color well 110 does not wash out of color well 110 and the cured second color component C2 in color well 112 does not wash out of color well 112. In contrast, the uncured second color component C2 in color well 114 washes out of color well 114.

FIG. 2L is a diagram illustrating one embodiment of first color component C1 and second color component C2 and multilevel structure 106 after multilevel structure 106 in color well 114 has been etched away to expose blocking layer 104. Multilevel structure 106 is etched away in color well 114 and at the tops 122 of ribs 108a-108d to reduce the thickness T of multilevel structure 106. First color component C1 and second color component C2 and the tops 122 of ribs 108a-108d are substantially planar. In one embodiment, this etch is a dry etch. In one embodiment, this etch is a plasma dry etch. In one embodiment, this etch includes at least one of fluorine gas and oxygen. In other embodiments, first color component C1 and/or second color component C2 etch faster than multilevel structure 106, such that first color component C1 is recessed in color well 110 and/or second color component C2 is recessed in color well 112 with respect to the tops 122 of ribs 108a-108d.

FIG. 2M is a diagram illustrating one embodiment of blocking layer 104 etched away in color well 114. During this etch, any residual layer or residual material of multilevel structure 106 in color well 114 is etched away and blocking layer 104 in color well 114 is etched away to expose substrate 102. After this etch, the floor 124 of color well 114 is substrate 102. In one embodiment, this etch is a dry etch. In one embodiment, this etch is a plasma dry etch. In one embodiment, this etch includes at least one of fluorine gas and oxygen. Next, color well 114 is filled with the third color component C3.

FIG. 2N is a diagram illustrating one embodiment of color well 114 filled with a third color component C3 that is different than the first color component C1 and the second color component C2. The third color component C3 is a single color, such as red, green, blue, white, cyan, yellow, magenta, or another suitable color. As color well 114 is filled, a slight underfill or doctor blade may be used to avoid smearing across the top 122 of multilevel structure 106. In one embodiment, the third color component C3 is applied in a slot-die process. In one embodiment, the third color component C3 is applied in a gravure process. In one embodiment, the third color component C3 is a negative tone color filter dye.

FIG. 2O is a diagram illustrating the third color component C3 in color well 114 being cured. An ultraviolet light is applied through substrate 100 and into third color component C3 in color well 114. This cures the third color component C3 in color well 114. Blocking layer 104 blocks the ultraviolet light and prevents the ultraviolet light from curing residual third color component C3 on multilevel structure 106.

In one embodiment, cured first color component C1 and cured second color component C2 block the ultraviolet light and prevent any residual third color component C3 on the first color component C1 and/or the second color component C2 from being cured. In other embodiments, cured first color component C1 and cured second color component C2 do not block the ultraviolet light and care is taken to prevent residual third color component C3 from being on cured first color component C1 and cured second color component C2 or it is removed prior to or after curing.

FIG. 2P is a diagram illustrating one embodiment of a color fitter array 126 after residual third color component C3 has been washed away. In this wash, the cured first color component C1 in color well 110 does not wash out of color well 110, the cured second color component C2 in color well 112 does not wash out of color well 112, and the third color component C3 in color well 114 does not wash out of color well 114. In contrast, any uncured residual third color component C3 is washed away. Color fitter array 126 is similar to color filter array 20 of FIG. 1.

Color filter array 126 includes multilevel structure 106 and substrate structure 100. Multilevel structure 106 includes ribs 108a-108d that define color wells 110, 112, and 114 in multilevel structure 106. The ribs 108a-108d and blocking layer 104 are the side walls of color wells 110, 112, and 114. Substrate 102 is the floor of each of the color wells 110, 112, and 114. Multilevel structure 106, including ribs 108a-108d, has a bottom side 128 and a top side 122. The bottom side 128, which is the bottom side 128 of each of the ribs 108a-108d, is attached to blocking layer 104 of substrate structure 100. The top side 122, which is the top side 122 of each of the ribs 108a-108d, is unattached. Also, the top side 122 of each of the ribs 108a-108d is planar. Each of the color wells 110, 112, and 114 is rectangular and has a depth D. In one embodiment, color filter array 126 includes color wells 110, 112, and 114 in a matrix of color wells. In one embodiment, color filter array 126 includes color wells 110, 112, and 114 in a matrix of color wells, where each of the color wells is a sub-pixel and a group of color wells make-up a pixel in a display.

Color wells 110, 112, and 114 are filled with color components that are cured. Each of the color wells 110, 112, and 114 is filled with a single color, such as red, green, blue, white, cyan, yellow, magenta, or another suitable color. First color well 110 is filled with a first color component C1, second color well 112 is filled with a second color component C2, and third color well 114 is filled with a third color component C3. The color component in each of the color wells 110, 112, and 114 is planar with the top side 122 of the ribs 108a-108d. Light is passed through one of the color wells 110, 112, and 114 to display the selected color. In other embodiments, the color component in each of the color wells 110, 112, and 114 is above or below and not planar with the top side 122 of the ribs 108a-108d.

Blocking layer 104 is opaque and visible through ribs 108a-108d to provide a black matrix between color wells 110, 112, and 114.

Color filter array 126 is manufactured in a roll-to-roll process that reduces cost and provides high resolution and high speed manufacturability. Color filter array 126 can be used in display technologies, such as LCD, OLED, and electrophoretic display technologies.

FIGS. 3A-3L are diagrams illustrating a second method of manufacturing a color filter array similar to color filter array 20 of FIG. 1.

Figure 3A:
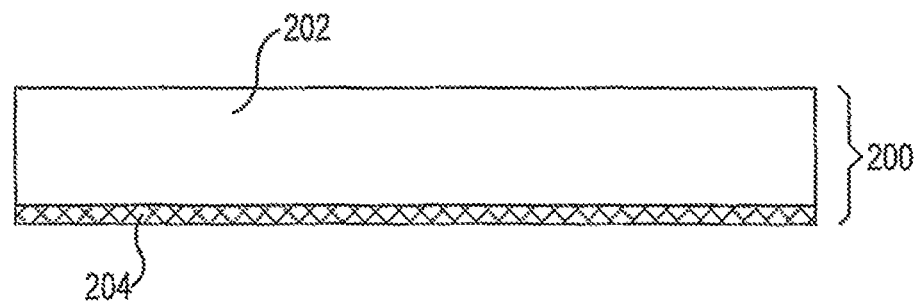
FIGS. 3A-3L are diagrams illustrating a second method of manufacturing a color filter array.

FIG. 3A is a diagram illustrating one embodiment of a first substrate structure 200 that includes a first substrate 202 and a release layer 204. Release layer 204 is applied to one side of first substrate 202. In one embodiment, first substrate 202 is a polymer substrate. In one embodiment, release layer 204 includes a thin oxide layer.

Figure 3B:
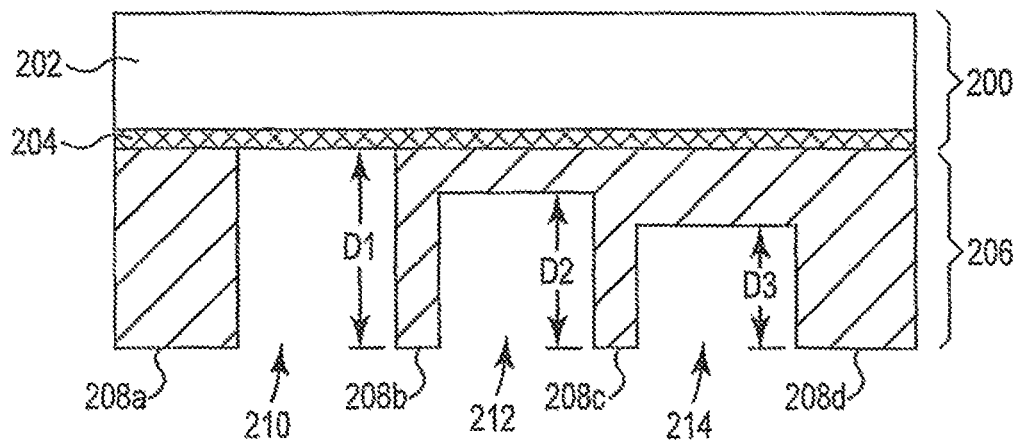

FIG. 3B is a diagram illustrating one embodiment of a multilevel structure 206 formed on release layer 204. Multilevel structure 206 is a flexible multilevel structure. In one embodiment, multilevel structure 206 is a polymer.

Multilevel structure 206 has different lateral patterns at different depths or vertical heights. Multilevel structure 206 includes ribs 208a-208d that define color wells 210, 212, and 214. In one embodiment, multilevel structure 206 is similar to well structure 22 (shown in FIG. 1). In one embodiment, ribs 208a-208d are similar to ribs 26 (shown in FIG. 1). In one embodiment, color wells 210, 212, and 214 are similar to color wells 28, 30, and 32 (shown in FIG. 1).

Each of the color wells 210, 212, and 214 has a different depth. Color well 210 has depth D1, color well 212 has depth D2, and color well 214 has depth D3. The differences in depths D1-D3 between color wells 210, 212, and 214 are exaggerated to illustrate the process. In one embodiment, each of the color wells 210, 212, and 214 is on the order of 5-10 microns deep and the differences in depths D1-D3 are on the order of 100's of nanometers.

Multilevel structure 206 is imprinted on release layer 204 in a roll-to-roll process that includes a flexible press. In this process, a thin layer of liquid polymer is coated onto release layer 204. Next, a stamp having a three dimensional structure corresponding to multilevel structure 206 is pressed into the liquid polymer. The liquid polymer is then cured, such as by shining an ultraviolet light onto the polymer to fix the polymer. In one embodiment, the liquid polymer is applied in a reverse gravure process. In one embodiment, the liquid polymer is applied in a slot-die process. In other embodiments, a different process is used to form multilevel structure 206 on release layer 204.

Figure 3C:
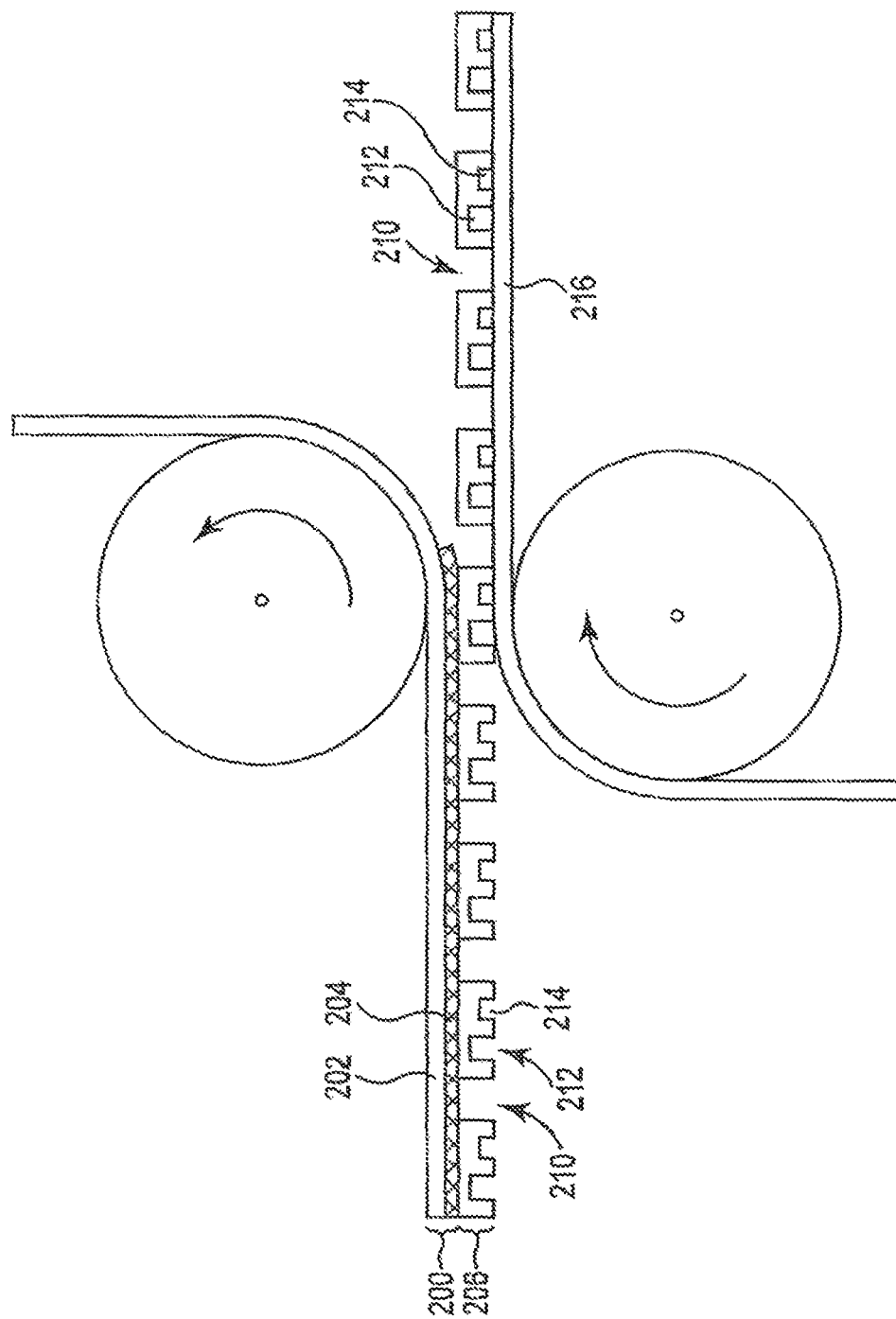

FIG. 3C is a diagram illustrating one embodiment of transferring multilevel structure 206 to a second substrate structure 216. Multilevel structure 206 is rolled onto second substrate structure 216 and permanently bonded to second substrate structure 216 to provide closed color wells, such as color wells 212 and 214.

Second substrate structure 216 is flexible and transparent to at least is ultraviolet light. In one embodiment, second substrate structure 216 is a polymer substrate. In other embodiments, second substrate structure 216 is not transparent to ultraviolet light.

Figure 3D:
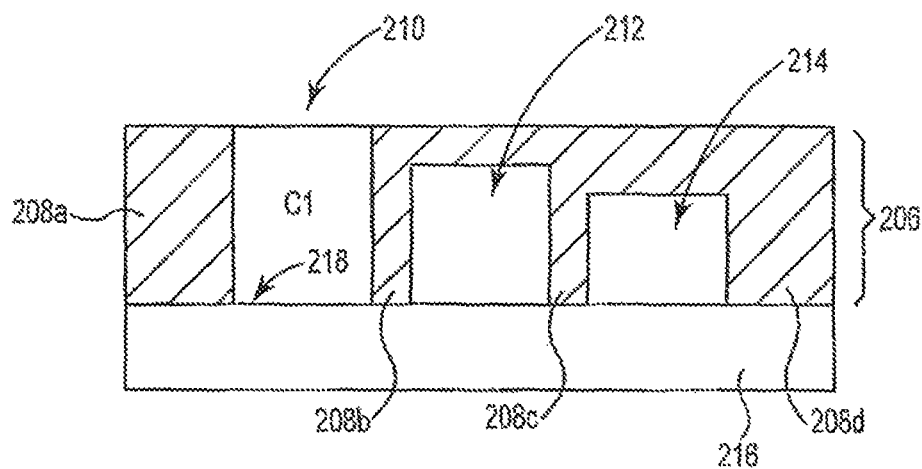

FIG. 3D is a diagram illustrating one embodiment of color well 210 filled with a first color component C1. The first color component C1 is a single color, such as red, green, blue, white, cyan, yellow, magenta, or another suitable color. As color well 210 is filled, a slight underfill or a doctor blade may be used to avoid smearing across the top of multilevel structure 206. In one embodiment, the first color component C1 is applied in a slot-die process. In one embodiment, the first color component C1 is applied in a gravure process. In one embodiment, the first color component C1 is a negative tone color filter dye.

Optionally, prior to filling color well 210, any residual layer or residual material of multilevel structure 206 in color well 210 is etched away. After this etch, the floor 218 of color well 210 is second substrate structure 216. In one embodiment, this etch is a dry etch. In one embodiment, this etch is a plasma dry etch. In one embodiment, this etch includes at least one of fluorine gas and oxygen.

Figure 3E:
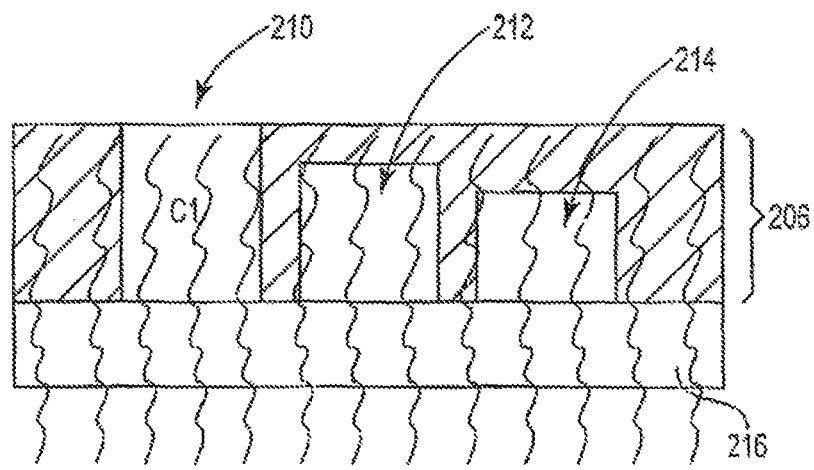

FIG. 3E is a diagram illustrating the first color component C1 in color well 210 being cured. An ultraviolet light is applied through second substrate structure 216 to a first side of multilevel structure 206 and into first color component C1 in color well 210. This cures the first color component C1 in color well 210. In one embodiment, multilevel structure 206 is opaque to ultraviolet light, such that multilevel structure 206 blocks the ultraviolet light and prevents the ultraviolet light from curing any of the first color component C1 that may be left on multilevel structure 206 after filling color well 210, which reduces overcoat and smearing problems.

In one embodiment, after curing the first color component C1 in color well 210, multilevel structure 206 and second substrate structure 216 are washed to remove impurities and uncured first color component C1. In this wash, the cured first color component C1 in color well 210 does not wash out of color well 210.

In one other embodiment, the first color component C1 in color well 210 is cured by applying an ultraviolet light from the other side, i.e., the side opposing the first side, of multilevel structure 206. In other embodiments, the first color component C1 in color well 210 is thermally cured by applying heat.

Figure 3F:
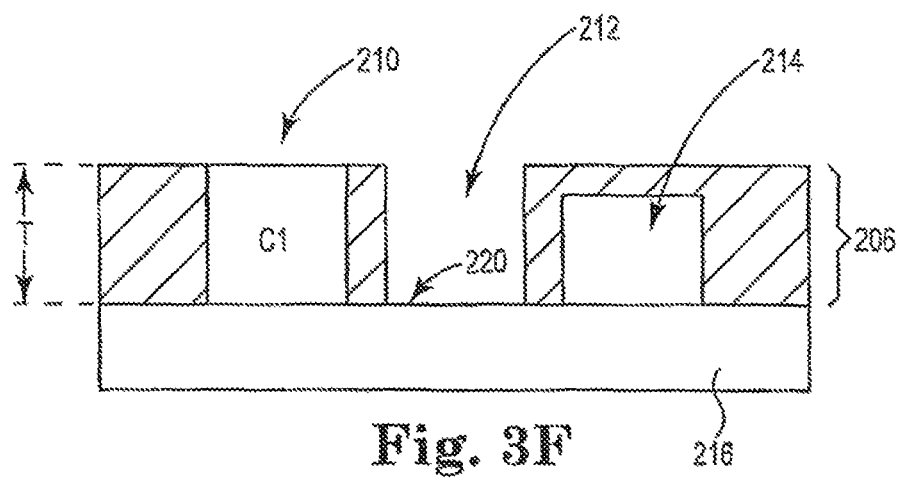

FIG. 3F is a diagram illustrating one embodiment of first color component C1 and multilevel structure 206 after multilevel structure 206 has been etched away to expose color well 212. Multilevel structure 206 is etched away to uncover color well 212, which reduces the thickness T of multilevel structure 206. First color component C1 is substantially planar with multilevel structure 206.

During this etch, any residual layer or residual material of multilevel structure 206 in color well 212 is etched away. After this etch, the floor 220 of color well 212 is second substrate structure 216. In one embodiment, this etch is a dry etch. In one embodiment, this etch is a plasma dry etch. In one embodiment, this etch includes at least one of fluorine gas and oxygen. In other embodiments, first color component C1 etches faster than multilevel structure 206, such that first color component C1 is recessed in color well 210 with respect to multilevel structure 206.

Figure 3G:
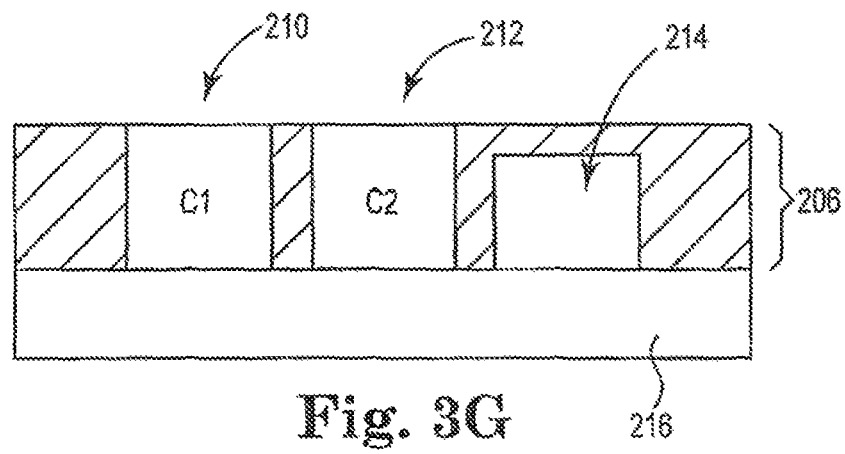

FIG. 3G is a diagram illustrating one embodiment of color well 212 filled with a second color component C2 that is different than the first color component C1. The second color component C2 is a single color, such as red, green, blue, white, cyan, yellow, magenta, or another suitable color. As color well 212 is filled, a slight underfill or doctor blade may be used to avoid smearing on multilevel structure 206. In one embodiment, the second color component C2 is applied in a slot-die process. In one embodiment, the second color component C2 is applied in a gravure process. In one embodiment, the second color component C2 is a negative tone color filter dye.

Figure 3H:
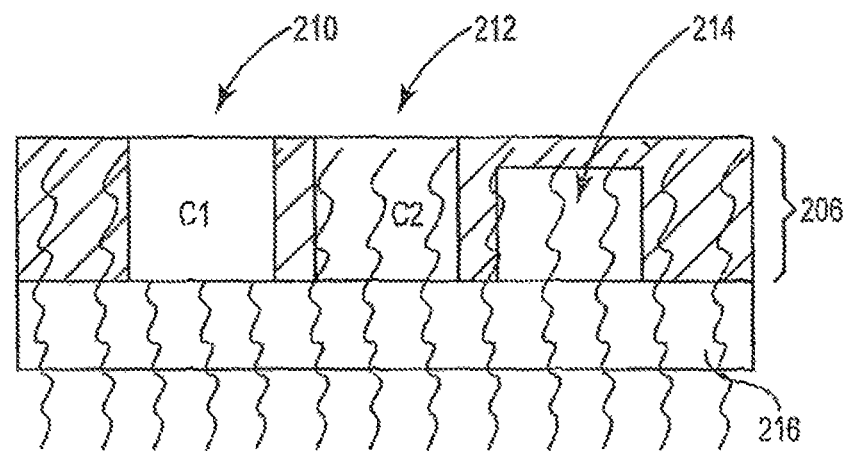

FIG. 3H is a diagram illustrating the second color component C2 in color well 212 being cured. An ultraviolet light is applied through second substrate structure 216 to a first side of multilevel structure 206 and into second color component C2 in color well 212. This cures the second color component C2 in color well 212. The cured first color component C1 blocks the ultraviolet light and prevents any residual second color component C2 on the first color component C1 from being cured. In other embodiments, cured first color component C1 does not block the ultraviolet light and care is taken to prevent residual second color component C2 from being on cured first color component C1 or it is removed prior to curing.

In one embodiment, multilevel structure 206 is opaque to ultraviolet light, such that multilevel structure 206 blocks the ultraviolet light and prevents the ultraviolet light from curing any of the second color component C2 that may be left on multilevel structure 206 after filling color well 212. This reduces overcoat and smearing problems.

In one embodiment, after curing the second color component C2 in color well 212, multilevel structure 206 and second substrate structure 216 are washed to remove impurities and uncured second color component C2. In this wash, the cured first color component C1 in color well 210 and the cured second color component C2 in color well 212 do not wash out.

In one other embodiment, the second color component C2 in color well 212 is cured by applying an ultraviolet light from the other side, i.e., the side opposing the first side, of multilevel structure 206. In other embodiments, the second color component C2 in color well 212 is thermally cured by applying heat.

Figure 3I:
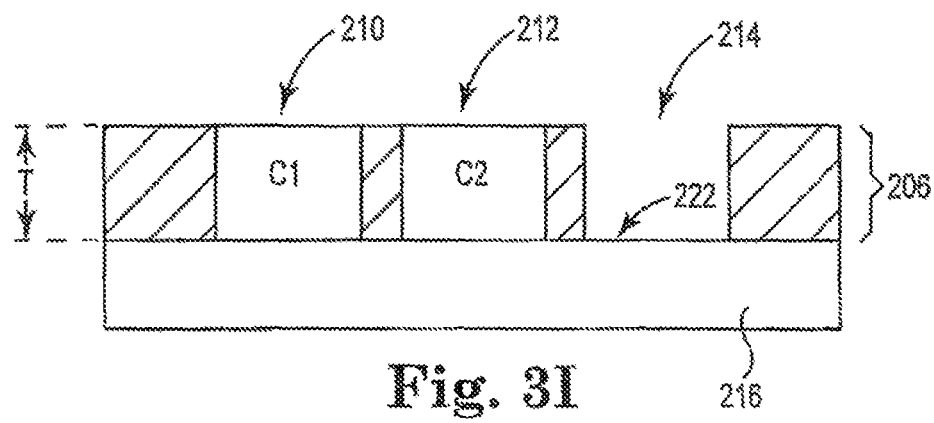

FIG. 3I is a diagram illustrating one embodiment of first color component C1 and second color component C2 and multilevel structure 206 after multilevel structure 206 has been etched away to expose color well 214. Multilevel structure 206 is etched away to uncover color well 214, which reduces the thickness T of multilevel structure 206. First color component C1 and second color component C2 are substantially planar with multilevel structure 206.

During this etch, any residual layer or residual material of multilevel structure 206 in color well 214 is etched away. After this etch, the floor 222 of color well 214 is second substrate structure 216. In one embodiment, this etch is a dry etch. In one embodiment, this etch is a plasma dry etch. In one embodiment, this etch includes at least one of fluorine gas and oxygen. In other embodiments, first color component C1 and second color component C2 etch faster than multilevel structure 206, such that first color component C1 is recessed in color well 210 and second color component C2 is recessed in color well 212 with respect to multilevel structure 206.

Figure 3J:
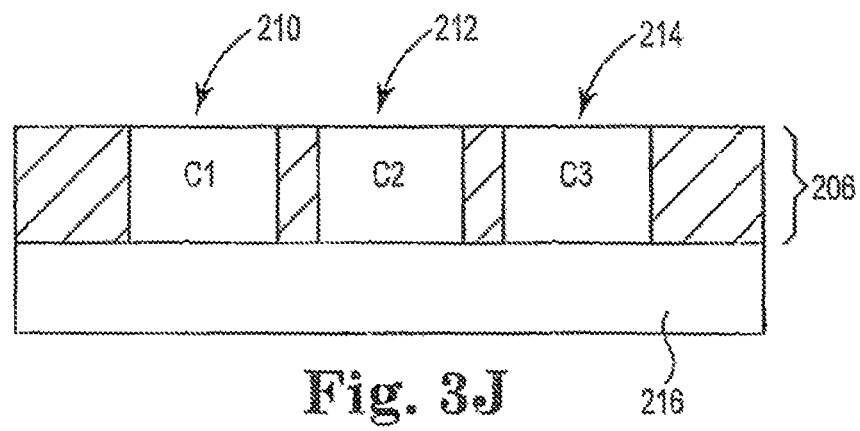

FIG. 3J is a diagram illustrating one embodiment of color well 214 filled with a third color component C3 that is different than the first color component C1 and the second color component C2. The third color component C3 is a single color, such as red, green, blue, white, cyan, yellow, magenta, or another suitable color. As color well 214 is filled, a slight underfill or doctor blade may be used to avoid smearing on multilevel structure 206. In one embodiment, the third color component C3 is applied in a slot-die process. In one embodiment, the third color component C3 is applied in a gravure process. In one embodiment, the third color component C3 is a negative tone color filter dye.

Figure 3K:
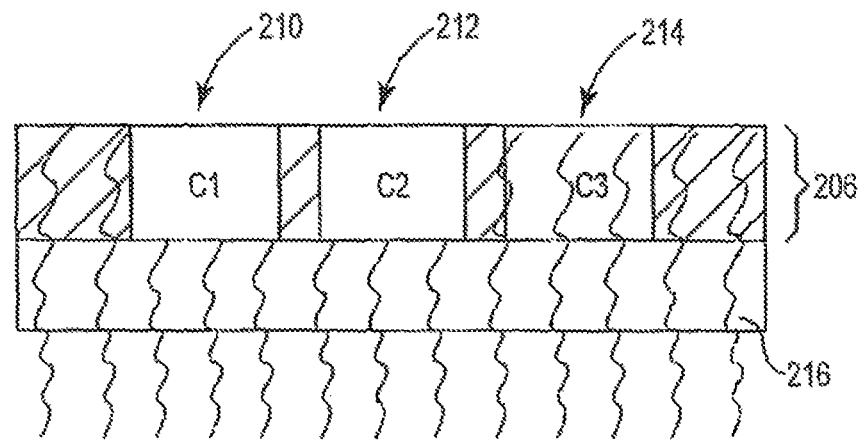

FIG. 3K is a diagram illustrating the third color component C3 in color well 214 being cured. An ultraviolet light is applied through second substrate structure 216 to a first side of multilevel structure 206 and into third color component C3 in color well 214. This cures the third color component C3 in color well 214. The cured first color component C1 and the cured second color component C2 block the ultraviolet light and prevent any residual third color component C3 on the first color component C1 and/or on the second color component C2 from being cured. In other embodiments, cured first color component C1 and cured second color component C2 do not block the ultraviolet light and care is taken to prevent residual third color component C3 from being on cured first color component C1 and/or on cured second color component C2 or it is removed prior to curing.

In one embodiment, multilevel structure 206 is opaque to ultraviolet light, such that multilevel structure 206 blocks the ultraviolet light and prevents the ultraviolet light from curing any of the third color component C3 that may be left on multilevel structure 206 after filling color well 214. This reduces overcoat and smearing problems.

In one embodiment, after curing the third color component C3 in color well 214, multilevel structure 206 and second substrate structure 216 are washed to remove impurities and uncured third color component C3. In this wash, the cured first color component C1 in color well 210 and the cured second color component C2 in color well 212 and the cured third color component C3 in color well 214 do not wash out.

In one other embodiment, the third color component C3 in color well 214 is cured by applying an ultraviolet light from the other side, i.e., the side opposing the first side, of multilevel structure 206. In other embodiments, the third color component C3 in color well 214 is thermally cured by applying heat.

Figure 3L:
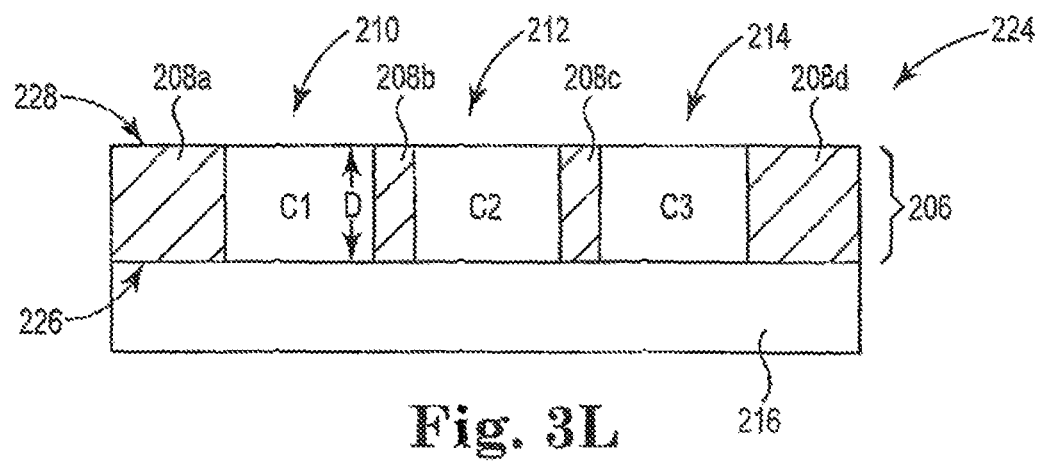

FIG. 3L is a diagram illustrating one embodiment of a color filter array 224 that is similar to color filter array 20 of FIG. 1. Color filter array 224 includes multilevel structure 206 and second substrate structure 216. Multilevel structure 206 includes ribs 208a-208d that define color wells 210, 212, and 214 in multilevel structure 206. The ribs 208a-208d are the side walls of color wells 210, 212, and 214. Second substrate structure 216 is the floor of each of the color wells 210, 212, and 214. Multilevel structure 206, including ribs 208a-208d, has a bottom side 226 and a top side 228. The bottom side 226, which is the bottom side 226 of each of the ribs 208a-208d, is attached to second substrate structure 216. The top side 228, which is the top side 228 of each of the ribs 208a-208d, is unattached. Also, the top side 228 of each of the ribs 208a-208d is planar. Each of the color wells 210, 212, and 214 is rectangular and has a depth D. In one embodiment, color filter array 224 includes color wells 210, 212, and 214 in a matrix of color wells. In one embodiment, color filter array 224 includes color wells 210, 212, and 214 in a matrix of color wells, where each of the color wells is a sub-pixel and a group of color wells make-up a pixel in a display.

Color wells 210, 212, and 214 are filled with color components that are cured. Each of the color wells 210, 212, and 214 is filled with a single color, such as red, green, blue, white, cyan, yellow, magenta, or another suitable color. First color well 210 is filled with a first color component C1, second color well 212 is filled with a second color component C2, and third color well 214 is filled with a third color component C3. The color component in each of the color wells 210, 212, and 214 is planar with the top side 228 of the ribs 208a-208d. Light is passed through one of the color wells 210, 212, and 214 to display the selected color. In other embodiments, the color component in each of the color wells 210, 212, and 214 is below or recessed from and not planar with the top side 228 of the ribs 208a-208d.

In one embodiment, an opaque layer is applied to one side of color filter array 224 to provide a black matrix between color wells 210, 212, and 214.

Color filter array 224 is manufactured in a roll-to-roll process that reduces cost and provides high resolution and high speed manufacturability. Color filter array 224 can be used in display technologies, such as LCD, OLED, and electrophoretic display technologies.

FIGS. 4A-4L are diagrams illustrating a third method of manufacturing a color filter array similar to color filter array 20 of FIG. 1.

Figure 4A:
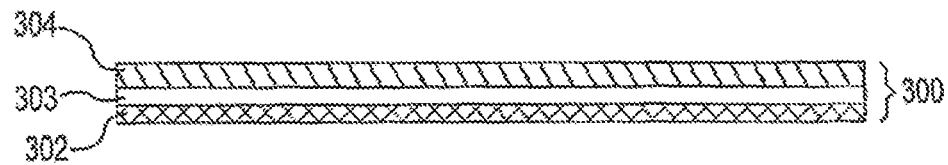
FIGS. 4A-4L are diagrams illustrating a third method of manufacturing a color filter array.

FIG. 4A is a diagram illustrating one embodiment of a substrate structure 300. In one embodiment, substrate structure 300 is similar to substrate structure 24 (shown in FIG. 1).

Substrate structure 300 includes a first conductive layer 302, a dielectric layer 303, and a second conductive layer 304. Dielectric layer 303 is applied on one side of first conductive layer 302, and second conductive layer 304 is applied on dielectric layer 304. In one embodiment, dielectric layer 303 is deposited on first conductive layer 302. In another embodiment, substrate structure 300 includes first conductive layer 302, but not dielectric layer 303 or second conductive layer 304. In another embodiment, substrate structure 300 includes first conductive layer 302 and dielectric layer 303, but not second conductive layer 304.

Substrate structure 300, including first conductive layer 302, dielectric layer 303, and second conductive layer 304, is transparent to light, such as visible light and/or ultraviolet light. Each of first conductive layer 302 and second conductive layer 304 is conductive and transparent. In one embodiment, first conductive layer 302 is a conductive polymer layer. In one embodiment, second conductive layer 304 is a conductive polymer layer. In one embodiment, first conductive layer 302 is a metal layer. In one embodiment, second conductive layer 304 is a metal layer. In other embodiments, substrate structure 300, including first conductive layer 302, dielectric layer 303, and second conductive layer 304, is not transparent to light.

Figure 4B:
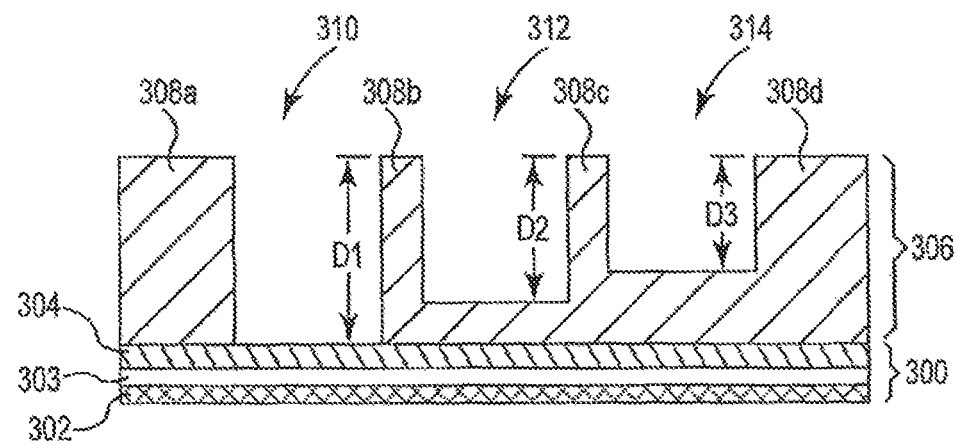

FIG. 4B is a diagram illustrating one embodiment of a multilevel structure 306 formed on second conductive layer 304. Multilevel structure 306 is a flexible multilevel structure. In one embodiment, multilevel structure 306 is a polymer.

Multilevel structure 306 has different lateral patterns at different depths or vertical heights. Multilevel structure 306 includes ribs 308a-308d that define color wells 310, 312, and 314. In one embodiment, multilevel structure 306 is similar to well structure 22 (shown in FIG. 1). In one embodiment, ribs 308a-308d are similar to ribs 26 (shown in FIG. 1). In one embodiment, color wells 310, 312, and 314 are similar to color wells 28, 30, and 32 (shown in FIG. 1).

Each of the color wells 310, 312, and 314 has a different depth. Color well 310 has depth D1, color well 312 has depth D2, and color well 314 has depth D3. The differences in depths D1-D3 between color wells 310, 312, and 314 are exaggerated to illustrate the process. In one embodiment, each of the color wells 310, 312, and 314 is on the order of 5-10 microns deep and the differences in depths D1-D3 are on the order of 100's of nanometers.

Multilevel structure 306 is imprinted on second conductive layer 304 in a roll-to-roll process that includes a flexible press. In this process, a thin layer of liquid polymer is coated onto second conductive layer 304. Next, a stamp having a three dimensional structure corresponding to multilevel structure 306 is pressed into the liquid polymer. The liquid polymer is then cured, such as by shining an ultraviolet light onto the polymer to fix the polymer. In one embodiment, the liquid polymer is applied in a reverse gravure process. In one embodiment, the liquid polymer is applied in a slot-die process. In other embodiments, a different process is used to form multilevel structure 306 on second conductive layer 304.

Figure 4C:
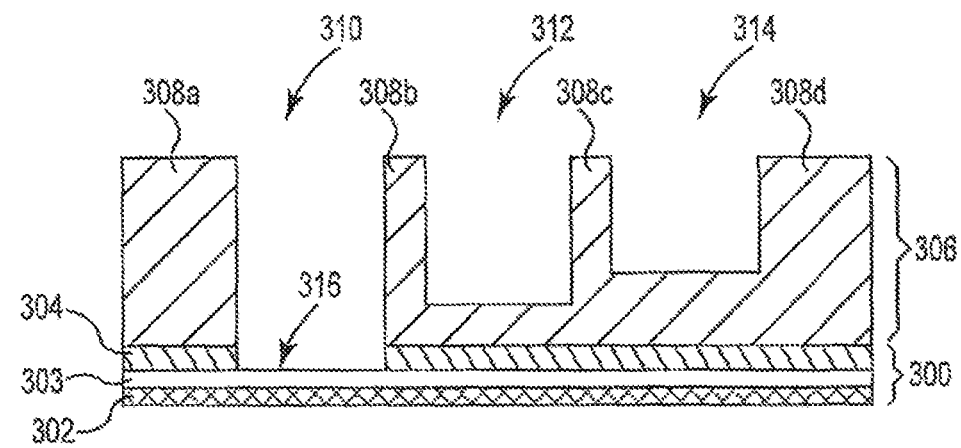

FIG. 4C is a diagram illustrating one embodiment of second conductive layer 304 etched away in color well 310. During this etch, any residual layer or residual material of multilevel structure 306 in color well 310 is etched away and second conductive layer 304 in color well 310 is etched away to expose dielectric layer 303. After this etch, the floor 316 of color well 310 is dielectric layer 303. In one embodiment, this etch is a dry etch. In one embodiment, this etch is a plasma dry etch. In one embodiment, this etch includes at least one of fluorine gas and oxygen. Next, color well 310 is filled with the first color component C1.

Figure 4D:
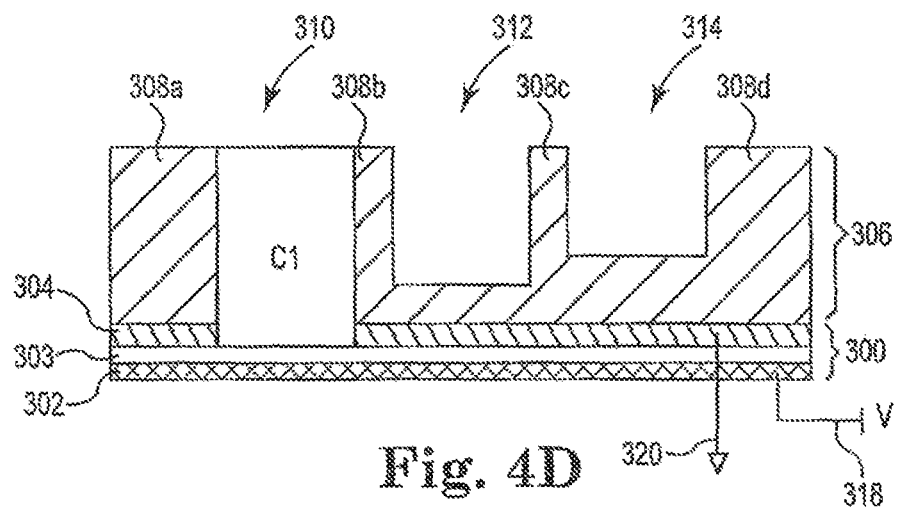

FIG. 4D is a diagram illustrating one embodiment of color well 310 filled with a first color component C1. The first color component C1 is a single color, such as red, green, blue, white, cyan, yellow, magenta, or another suitable color. In one embodiment, the first color component C1 is a dry toner ink.

To fill color well 310, an electric field or voltage V at 318 is applied to first conductive layer 302 and the first color component C1 is applied over multilevel structure 306. The first color component C1 is attracted into color well 310 by the electric field or voltage V at 318 on first conductive layer 302. Second conductive layer 304 is attached to a reference, such as ground, at 320 and operates to shield color wells 312 and 314 and multilevel structure 306 from the electric field or voltage, which prevents the first color component C1 from being attracted into color wells 312 and 314 and onto multilevel structure 306.

In another embodiment, substrate structure 300 includes first conductive layer 302, but not dielectric layer 303 or second conductive layer 304. In another embodiment, substrate structure 300 includes first conductive layer 302 and dielectric layer 303, but not second conductive layer 304. In either of these embodiments that do not include second conductive layer 304, multilevel structure 306 operates to shield color wells 312 and 314 and multilevel structure 306 from the electric field or voltage, which prevents the first color component C1 from being attracted into color wells 312 and 314 and onto multilevel structure 306.

Figure 4E:
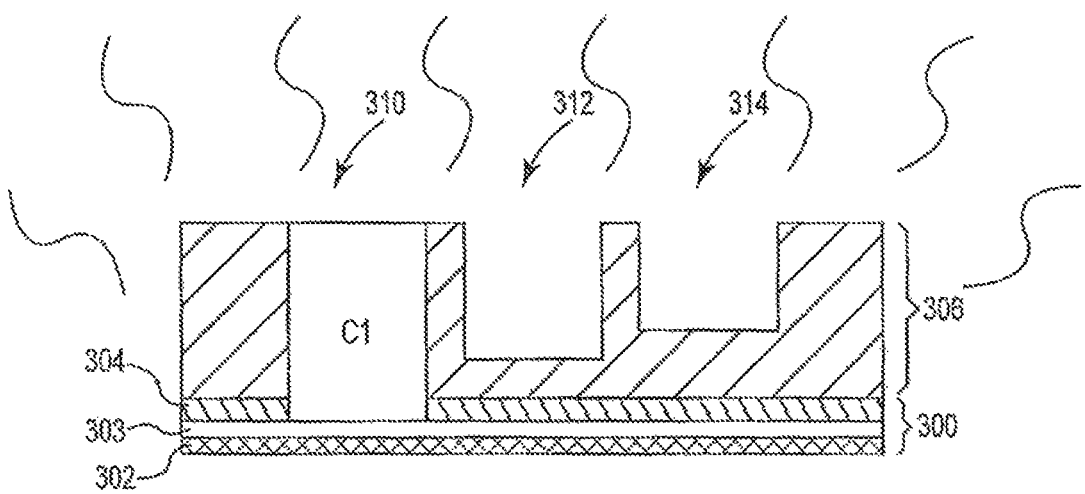

FIG. 4E is a diagram illustrating the first color component C1 in color well 310 being cured. A heat source (not shown) provides heat for thermally curing first color component C1 in color well 310. In one embodiment, a low heat is applied after each color component is added and a final high heat is applied after all color components have been added to finally cure the color components. In one embodiment, a high heat is applied after each color component is added to finally cure the added color component.

Figure 4F:
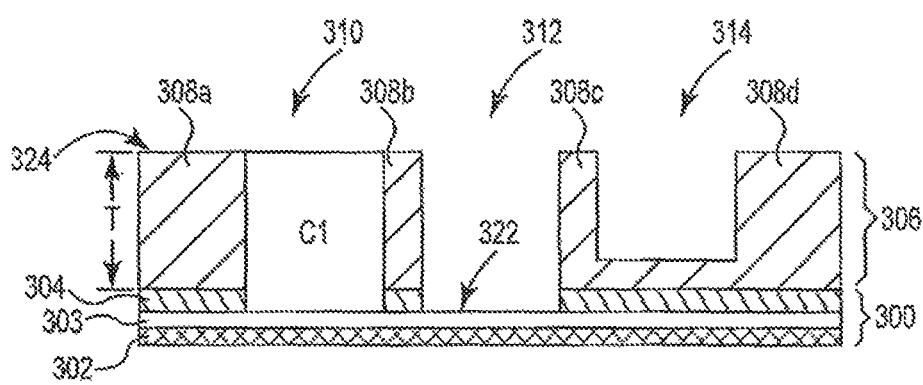

FIG. 4F is a diagram illustrating one embodiment of first color component C1 and multilevel structure 306 after multilevel structure 306 in color well 312 has been etched away and after second conductive layer 304 in color well 312 has been etched away to expose dielectric layer 303. After etching, the floor 322 of color well 312 is dielectric layer 303.

Multilevel structure 306 is etched away in color wells 312 and 314 and at the tops 324 of ribs 308a-308d to reduce the thickness T of multilevel structure 306. Also, first color component C1 and the tops 324 of ribs 308a-308d are substantially planar. In one embodiment, the multilevel structure 306 is etched in one etching process and the second conductive layer 304 is etched in another etching process. In one embodiment, etching includes a dry etch. In one embodiment, etching includes a plasma dry etch. In one embodiment, etching includes at least one of fluorine gas and oxygen. In other embodiments, first color component C1 etches faster than multilevel structure 306, such that first color component C1 is recessed in color well 310 with respect to the tops 324 of ribs 308a-308d.

Next, color well 312 is filled with the second color component C2.

Figure 4G:
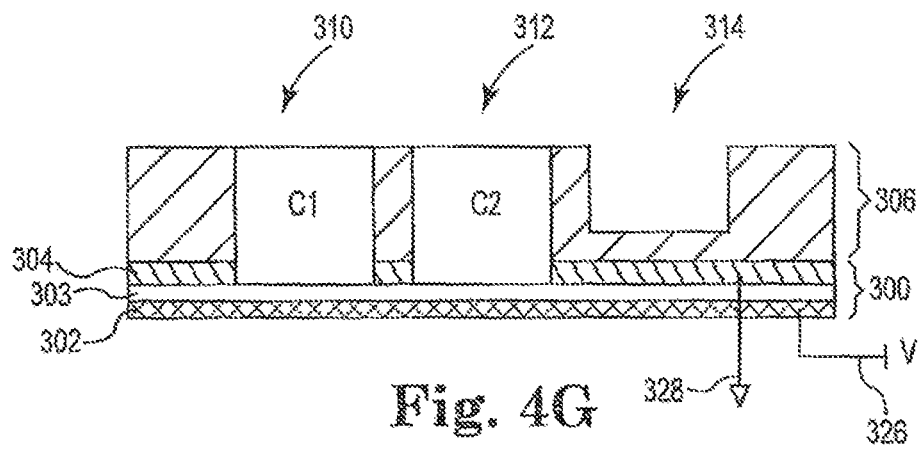

FIG. 4G is a diagram illustrating one embodiment of color well 312 filled with a second color component C2. The second color component C2 is a single color, such as red, green, blue, white, cyan, yellow, magenta, or another suitable color. Also, the second color component C2 is different than the first color component C1. In one embodiment, the second color component C2 is a dry toner ink.

To fill color well 312, an electric field or voltage V at 326 is applied to first conductive layer 302 and the second color component C2 is applied over multilevel structure 306. The second color component C2 is attracted into color well 312 by the electric field or voltage V at 326 on first conductive layer 302. Second conductive layer 304 is attached to a reference, such as ground, at 328 and operates to shield color well 314 and multilevel structure 306 from the electric field or voltage, which prevents the second color component C2 from being attracted into color well 314 and onto the multilevel structure 306. Also, first color component C1 shields color well 310 to prevent the second color component C2 from being attracted into color well 310.

In another embodiment, substrate structure 300 includes first conductive layer 302, but not dielectric layer 303 or second conductive layer 304. In another embodiment, substrate structure 300 includes first conductive layer 302 and dielectric layer 303, but not second conductive layer 304. In either of these embodiments that do not include second conductive layer 304, multilevel structure 306 and/or first color component C1 operate to shield color wells 310 and 314 and multilevel structure 306 from the electric field or voltage, which prevents the second color component C2 from being attracted into color wells 310 and 314 and onto multilevel structure 306.

Figure 4H:
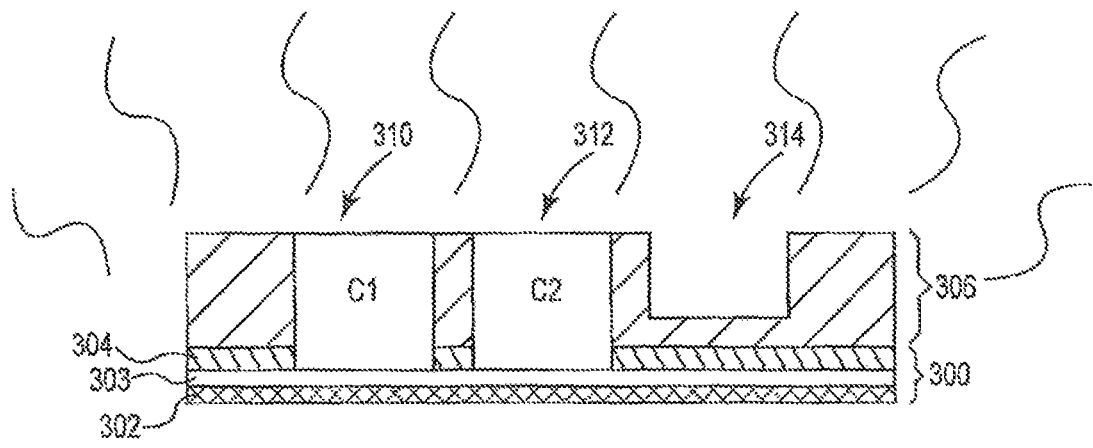

FIG. 4H is a diagram illustrating the second color component C2 in color well 312 being cured. A heat source (not shown) provides heat for thermally curing second color component C2 in color well 312. In one embodiment, a low heat is applied after each color component is added and a final high heat is applied after all color components have been added to finally cure the color components. In one embodiment, a high heat is applied after each color component is added to finally cure the added color component.

Figure 4I:
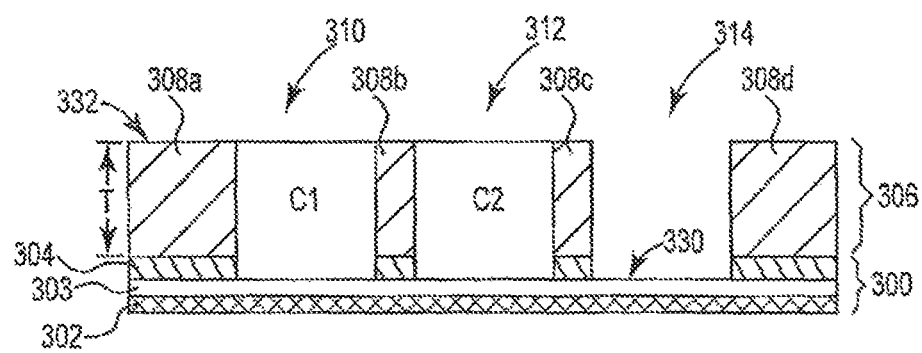

FIG. 4I is a diagram illustrating one embodiment of first color component C1 and second color component C2 and multilevel structure 306 after multilevel structure 306 in color well 314 has been etched away and after second conductive layer 304 in color well 314 has been etched away to expose dielectric layer 303. After etching, the floor 330 of color well 314 is dielectric layer 303.

Multilevel structure 306 is etched away in color well 314 and at the tops 332 of ribs 308*a*-308*d* to reduce the thickness T of multilevel structure 306. Also, first color component C1 and second color component C2 and the tops 332 of ribs 308*a*-308*d* are substantially planar. In one embodiment, the multilevel structure 306 is etched in one etching process and the second conductive layer 304 is etched in another etching process. In one embodiment, etching includes a dry etch. In one embodiment, etching includes a plasma dry etch. In one embodiment, etching includes at least one of fluorine gas and oxygen. In other embodiments, first color component C1 and second color component C2 etch faster than multilevel structure 306, such that first color component C1 is recessed in color well 310 and second color component C2 is recessed in color well 312 with respect to the tops 332 of ribs 308*a*-308*d*.

Next, color well 314 is filled with the third color component C3.

Figure 4J:
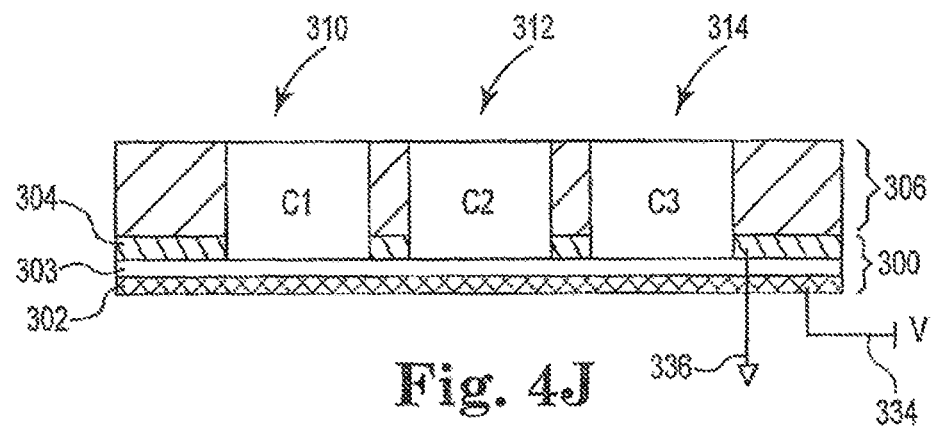

FIG. 4J is a diagram illustrating one embodiment of color well 314 filled with a third color component C3. The third color component C3 is a single color, such as red, green, blue, white, cyan, yellow, magenta, or another suitable color. Also, the third color component C3 is different than the first color component C1 and the second color component C2. In one embodiment, the third color component C3 is a dry toner ink.

To fill color well 314, an electric field or voltage V at 334 is applied to first conductive layer 302 and the third color component C3 is applied over multilevel structure 306. The third color component C3 is attracted into color well 314 by the electric field or voltage V at 334 on first conductive layer 302. Second conductive layer 304 is attached to a reference, such as ground, at 336 and operates to shield multilevel structure 306 from the electric field or voltage, which prevents the third color component C3 from being attracted onto multilevel structure 306. Also, first color component C1 shields color well 310 and second color component C2 shields color well 312 to prevent the third color component C3 from being attracted into color wells 310 and 312, respectively.

In another embodiment, substrate structure 300 includes first conductive layer 302, but not dielectric layer 303 or second conductive layer 304. In another embodiment, substrate structure 300 includes first conductive layer 302 and dielectric layer 303, but not second conductive layer 304. In either of these embodiments that do not include second conductive layer 304, multilevel structure 306 and/or first color component C1 and/or second color component C2 operate to shield multilevel structure 306 and color wells 310 and 312 from the electric field or voltage, which prevents the third color component C3 from being attracted into color wells 310 and 312 and onto multilevel structure 306.

Figure 4K:
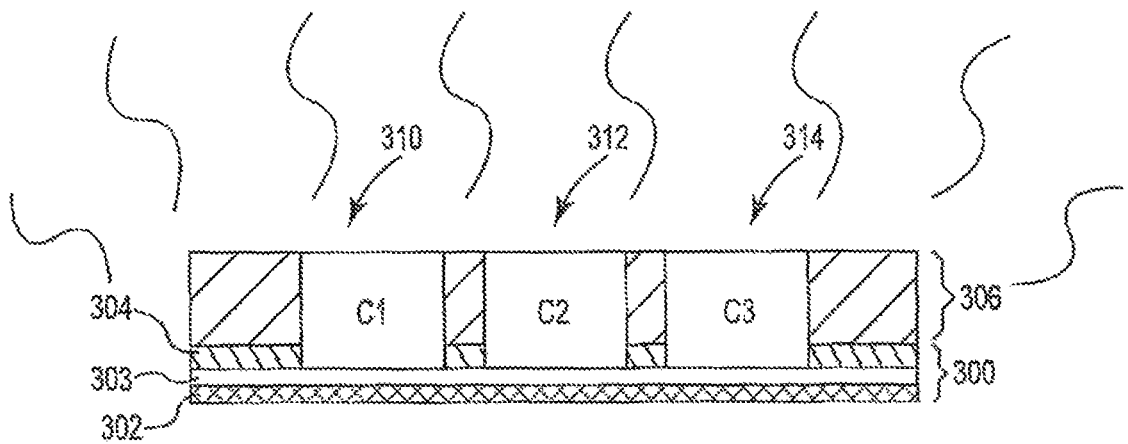

FIG. 4K is a diagram illustrating the third color component C3 in color well 314 being cured. A heat source (not shown) provides heat for thermally curing third color component C3 in color well 314. In one embodiment, a low heat is applied after each color component is added and a final high heat is applied after all color components have been added to finally cure the color components. In one embodiment, a high heat is applied after each color component is added to finally cure the added color component.

Figure 4L:
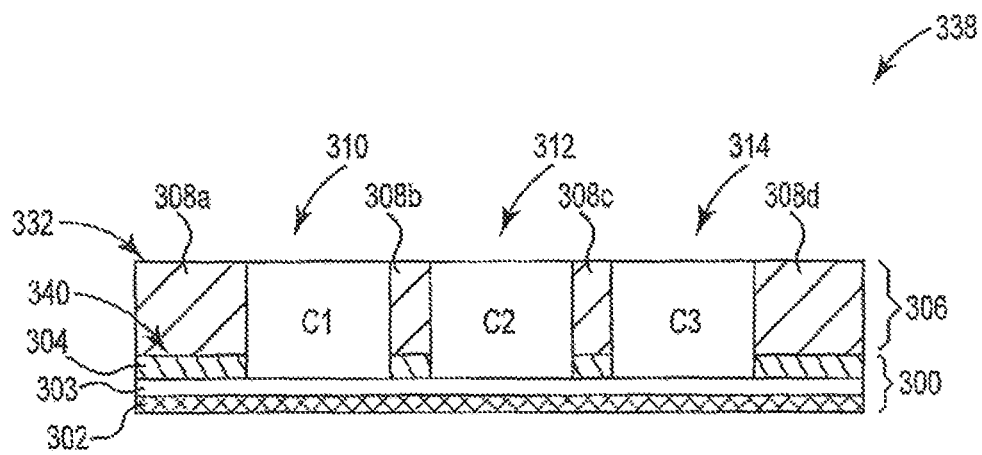

FIG. 4L is a diagram illustrating one embodiment of a color filter array 338 that is similar to color filter array 20 of FIG. 1.

Color filter array 338 includes multilevel structure 306 and substrate structure 300. Multilevel structure 306 includes ribs 308*a*-308*d* that define color wells 310, 312, and 314 in multilevel structure 306. The ribs 308*a*-308*d* and second conductive layer 304 are the side walls of color wells 310, 312, and 314. Dielectric layer 303 is the floor of each of the color wells 310, 312, and 314. Multilevel structure 306, including ribs 308*a*-308*d*, has a bottom side 340 and a top side 332. The bottom side 340, which is the bottom side 340 of each of the ribs 308*a*-308*d*, is attached to second conductive layer 304 of substrate structure 300. The top side 332, which is the top side 332 of each of the ribs 308*a*-308*d*, is unattached. Also, the top side 332 of each of the ribs 308*a*-308*d* is planar. Each of the color wells 310, 312, and 314 is rectangular and has a depth D. In one embodiment, color filter array 338 includes color wells 310, 312, and 314 in a matrix of color wells. In one embodiment, color filter array 338 includes color wells 310, 312, and 314 in a matrix of color wells, where each of the color wells is a sub-pixel and a group of color wells make-up a pixel in a display.

Color wells 310, 312, and 314 are filled with color components that are cured. Each of the color wells 310, 312, and 314 is filled with a single color, such as red, green, blue, white, cyan, yellow, magenta, or another suitable color. First color well 310 is filled with a first color component C1, second color well 312 is filled with a second color component C2, and third color well 314 is filled with a third color component C3. The color component in each of the color wells 310, 312, and 314 is planar with the top side 332 of the ribs 308a-308d. Light is passed through one of the color wells 310, 312, and 314 to display the selected color. In other embodiments, the color component in each of the color wells 310, 312, and 314 is below and not planar with the top side 332 of the ribs 308a-308d.

In one embodiment, an opaque layer is applied to one side of color filter array 338 to provide a black matrix between color wells 310, 312, and 314. In one embodiment, substrate structure 300 is not transparent to light and substrate structure 300 operates to provide the black matrix between color wells 310, 312, and 314.

Color filter array 338 is manufactured in a roll-to-roll process that reduces cost and provides high resolution and high speed manufacturability. Color filter array 338 can be used in display technologies, such as LCD, OLED, and electrophoretic display technologies.

Figure 5A:
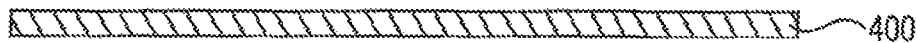
FIGS. 5A-5P are diagrams illustrating a fourth method of manufacturing a color filter array.
Figure 5B:
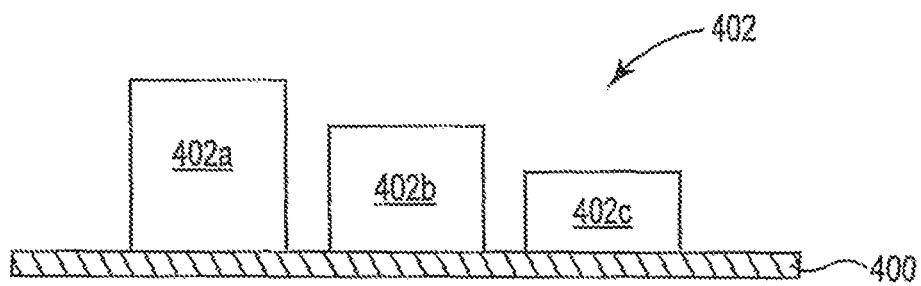
Figure 5C:
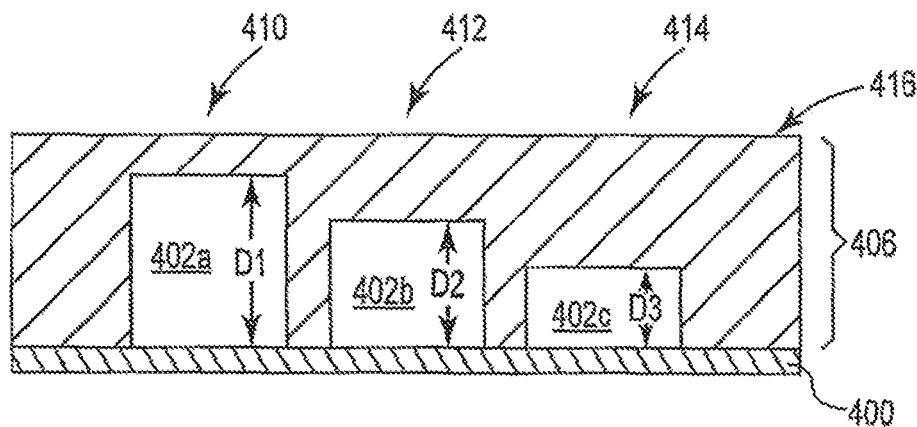
Figure 5D:
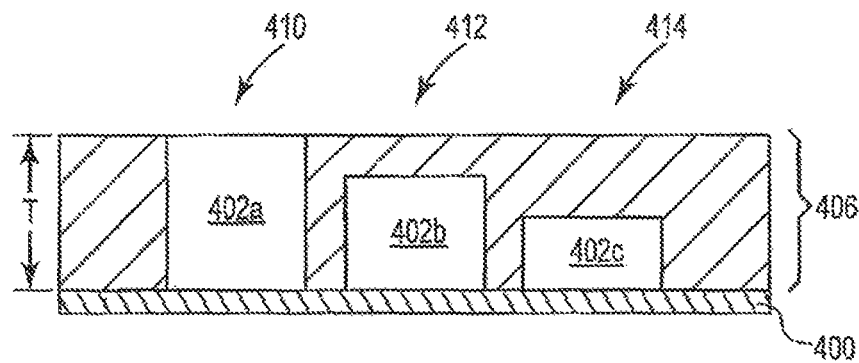
Figure 5E:
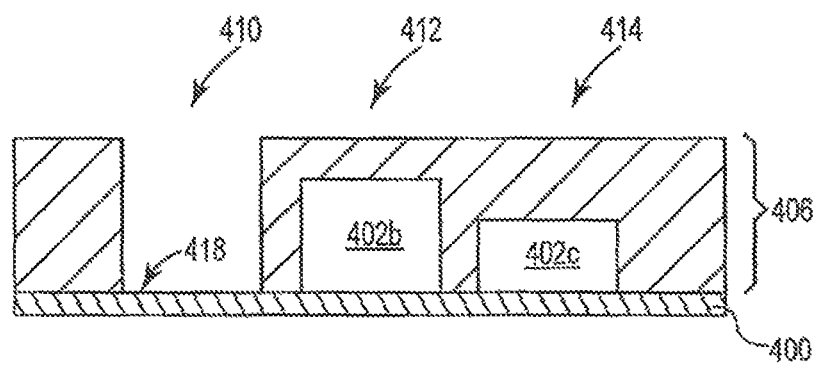
Figure 5F:
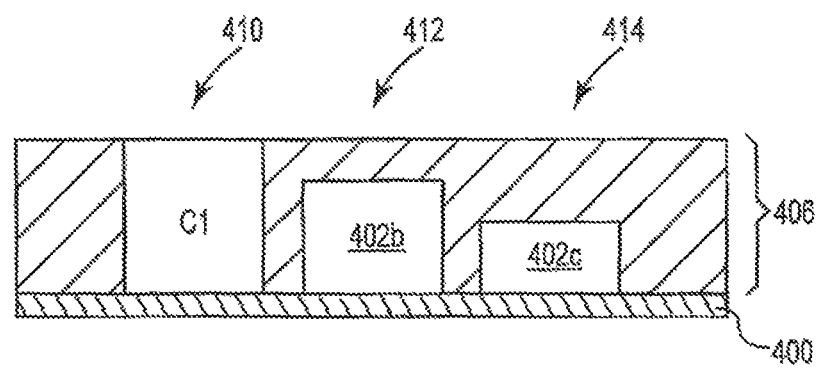
Figure 5G:
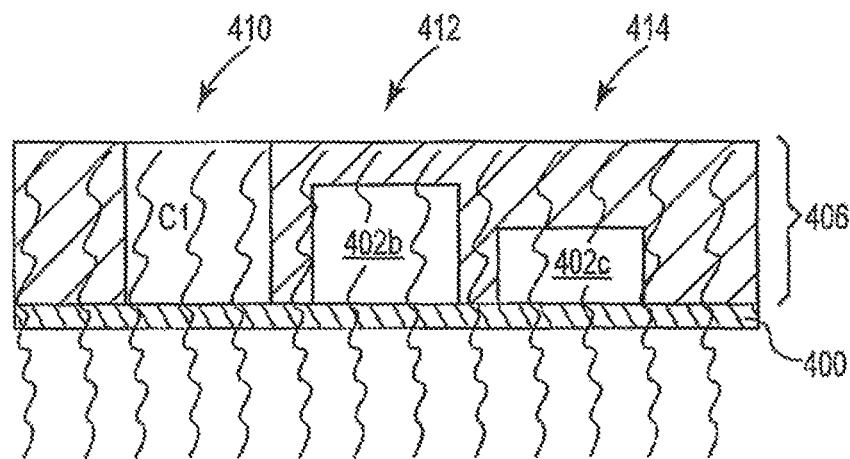
Figure 5H:
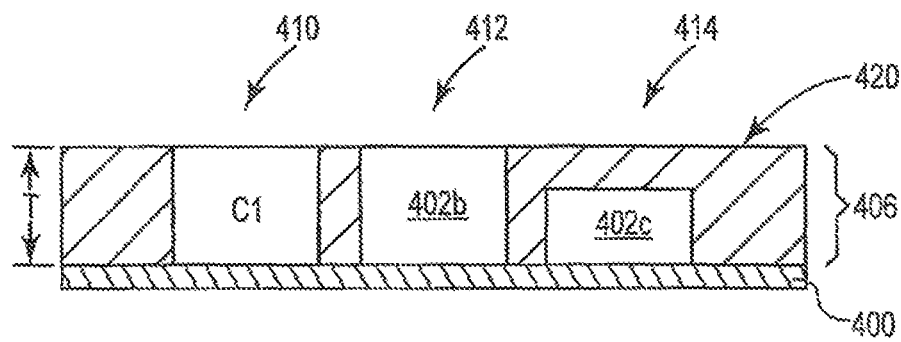
Figure 5I:
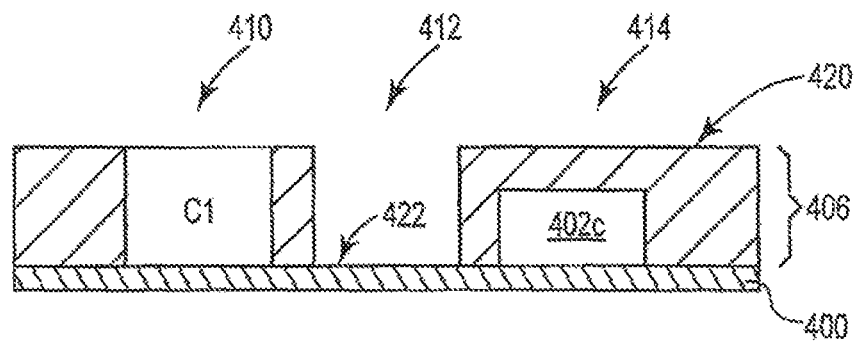
Figure 5J:
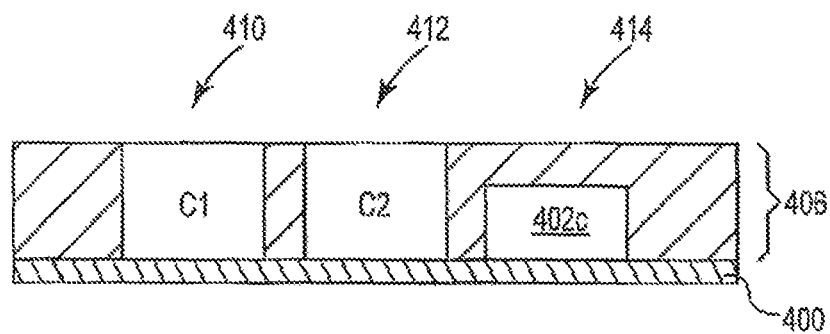
Figure 5K:
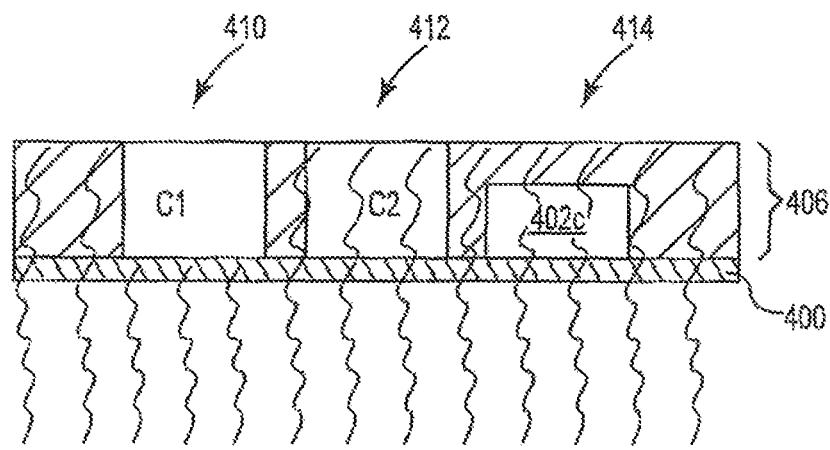
Figure 5L:
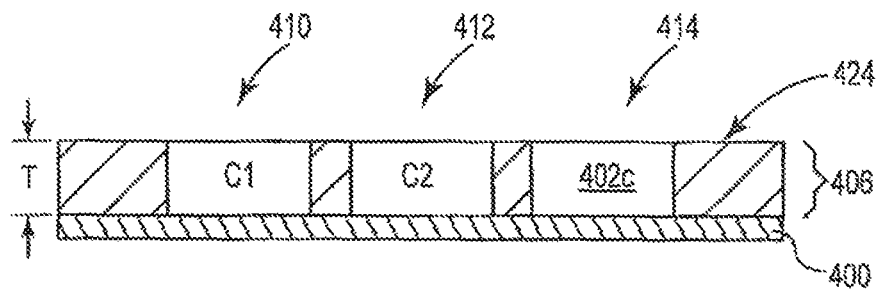
Figure 5M:
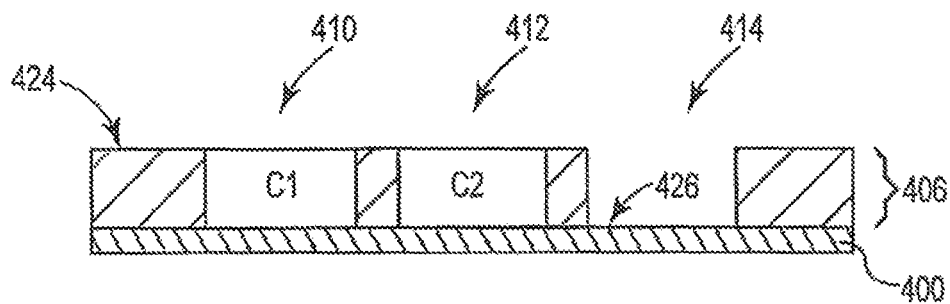
Figure 5N:
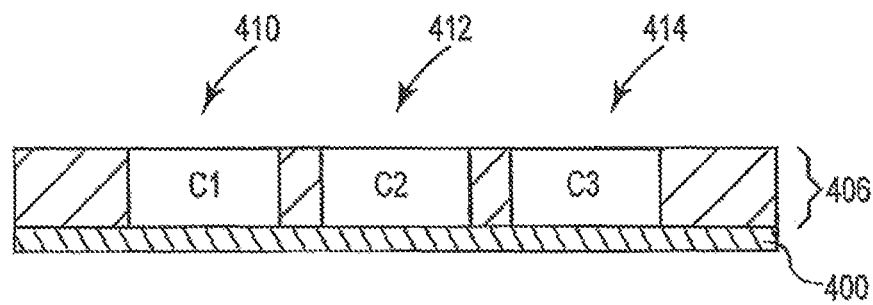
Figure 5O:
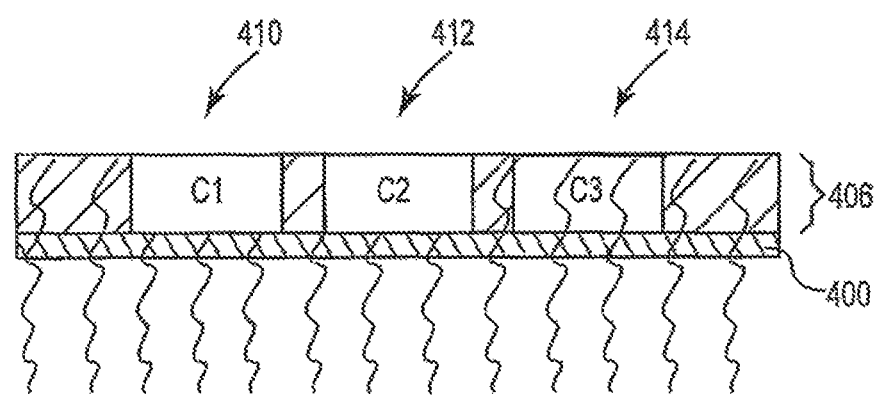
Figure 5P:
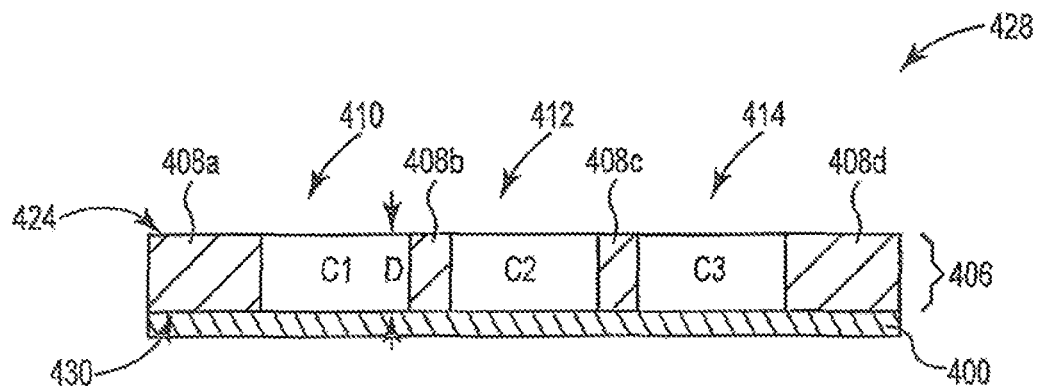

FIGS. 5A-5P are diagrams illustrating a fourth method of manufacturing a color filter array similar to color filter array 20 of FIG. 1.

FIG. 5A is a diagram illustrating one embodiment of a substrate structure 400. In one embodiment, substrate structure 400 is similar to substrate structure 24 (shown in FIG. 1).

Substrate structure 400 is transparent to at least ultraviolet light. In one embodiment, substrate structure 400 is a polymer substrate. In other embodiments, substrate structure 400 is opaque.

FIG. 5B is a diagram illustrating one embodiment of a block pattern 402 formed on substrate structure 400. Block pattern 402 is in the shape of colors wells that will be formed on substrate structure 400. Block pattern 402 includes first block 402a, second block 402b, and third block 402c, where different block depths or heights correspond to different color wells.

FIG. 5C is a diagram illustrating one embodiment of a multilevel structure 406 formed on block patter 402 and substrate structure 400. Multilevel structure 406 is a flexible multilevel structure. In one embodiment, multilevel structure 406 is a polymer.

Multilevel structure 406 is formed over block pattern 402 to have different lateral patterns having different depths. Block pattern 402 and multilevel structure 406 are made with different materials that have different etching characteristics, such that one can be etched away without significantly etching away the other. As described herein, block pattern 402 is etched away to make color wells 410, 412, and 414. In one embodiment, multilevel structure 406 is similar to well structure 22 (shown in FIG. 1). In one embodiment, color wells 410, 412, and 414 are similar to color wells 28, 30, and 32 (shown in FIG. 1).

Each of the block patterns 402a-402c and each of the color wells 410, 412, and 414 have a different depth. First block 402a and color well 410 have depth D1, second block 402b and color well 412 have depth D2, and third block 402c and color well 414 have depth D3. The differences in depths D1-D3 are exaggerated to illustrate the process. In one embodiment, each of the depths D1-D3 is on the order of 5-10 microns and the differences in depths D1-D3 are on the order of 100's of nanometers.

Multilevel structure 406 is applied on block pattern 402 and substrate structure 400 as a liquid polymer. Multilevel structure 406 is then cured, by shining an ultraviolet light onto the polymer to fix the polymer. The resulting multilevel structure 406 is planar at 416. In one embodiment, multilevel structure is cured by applying heat. In one embodiment, the liquid polymer is applied in a reverse gravure process. In one embodiment, the liquid polymer is applied in a slot-die process. In other embodiments, a different process is used to form multilevel structure 406.

FIG. 5D is a diagram illustrating one embodiment of multilevel structure 406 after multilevel structure 406 has been etched away to expose first block 402a. Multilevel structure 406 is etched away to uncover first block 402a, which reduces the thickness T of multilevel structure 406. In one embodiment, this etch is a dry etch. In one embodiment, this etch is a plasma dry etch. In one embodiment, this etch includes at least one of fluorine gas and oxygen.

FIG. 5E is a diagram illustrating one embodiment of multilevel structure 406 and block pattern 402 after first block 402a has been etched away. First block 402a is etched away to provide color well 410.

During this etch, any residual layer or residual material of first block 402a and/or multilevel structure 406 in color well 410 is etched away. After this etch, the floor 418 of color well 410 is substrate structure 400. In one embodiment, this etch is a dry etch. In one embodiment, this etch is a plasma dry etch. In one embodiment, this etch includes at least one of fluorine gas and oxygen. In one embodiment, this etch is a wet etch. In one embodiment, this etch is a wet etch including PRX. In one embodiment, this etch is a wet etch including solvation.

FIG. 5F is a diagram illustrating one embodiment of color well 410 filled with a first color component C1. The first color component C1 is a single color, such as red, green, blue, white, cyan, yellow, magenta, or another suitable color. As color well 410 is filled, a slight underfill or doctor blade may be used to avoid smearing on multilevel structure 406. In one embodiment, the first color component C1 is applied in a slot-die process. In one embodiment, the first color component C1 is applied in a gravure process. In one embodiment, the first color component C1 is a negative tone color filter dye.

FIG. 5G is a diagram illustrating the first color component C1 in color well 410 being cured. An ultraviolet light is applied through substrate structure 400 to a first side of multilevel structure 406 and into first color component C1 in color well 410. This cures the first color component C1 in color well 410.

In one embodiment, multilevel structure 406 is opaque to ultraviolet light, such that multilevel structure 406 blocks the ultraviolet light and prevents the ultraviolet light from curing any of the first color component C1 that may be left on multilevel structure 406 after filling color well 410. This reduces overcoat and smearing problems.

In one embodiment, after curing the first color component C1 in color well 410, multilevel structure 406 and substrate structure 400 are washed to remove impurities and uncured first color component C1. This does not wash out the cured first color component C1 in color well 410.

In one other embodiment, the first color component C1 in color well 410 is cured by applying an ultraviolet light from the other side, i.e., the side opposing the first side, of multilevel structure 406. In other embodiments, the first color component C1 in color well 410 is thermally cured by applying heat.

FIG. 5H is a diagram illustrating one embodiment of first color component C1 and multilevel structure 406 after multilevel structure 406 has been etched away to expose second block 402b. Multilevel structure 406 is etched away to uncover second block 402b, which reduces the thickness T of multilevel structure 406. First color component C1 is substantially planar with multilevel structure 406 at 420. In one embodiment, this etch is a dry etch. In one embodiment, this etch is a plasma dry etch. In one embodiment, this etch includes at least one of fluorine gas and oxygen.

FIG. 5I is a diagram illustrating one embodiment of multilevel structure 406 and block pattern 402 after second block 402b has been etched away. Second block 402b is etched away to provide color well 412.

During this etch, any residual layer or residual material of second block 402b and/or multilevel structure 406 in color well 412 is etched away. After this etch, the floor 422 of color well 412 is substrate structure 400. In one embodiment, this etch is a dry etch. In one embodiment, this etch is a plasma dry etch. In one embodiment, this etch includes at least one of fluorine gas and oxygen. In one embodiment, this etch is a wet etch. In one embodiment, this etch is a wet etch including PRX. In one embodiment, this etch is a wet etch including solvation. In other embodiments, first color component C1 etches faster than multilevel structure 406, such that first color component C1 is recessed in color well 410 with respect to multilevel structure 406 at 420.

FIG. 5J is a diagram illustrating one embodiment of color well 412 filled with a second color component C2 that is different than the first color component C1. The second color component C2 is a single color, such as red, green, blue, white, cyan, yellow, magenta, or another suitable color. As color well 412 is filled, a slight underfill or doctor blade may be used to avoid smearing on multilevel structure 406. In one embodiment, the second color component C2 is applied in a slot-die process. In one embodiment, the second color component C2 is applied in a gravure process. In one embodiment, the second color component C2 is a negative tone color filter dye.

FIG. 5K is a diagram illustrating the second color component C2 in color well 412 being cured. An ultraviolet light is applied through substrate structure 400 to a first side of multilevel structure 406 and into second color component C2 in color well 412. This cures the second color component C2 in color well 412. The cured first color component C1 blocks the ultraviolet light and prevents any residual second color component C2 on the first color component C1 from being cured. In other embodiments, cured first color component C1 does not block the ultraviolet light and care is taken to prevent residual second color component C2 from being on cured first color component C1 or it is removed prior to curing.

In one embodiment, multilevel structure 406 is opaque to ultraviolet light, such that multilevel structure 406 blocks the ultraviolet light and prevents the ultraviolet light from curing any of the second color component C2 that may be left on multilevel structure 406 after filling color well 412. This reduces overcoat and smearing problems.

In one embodiment, after curing the second color component C2 in color well 412, multilevel structure 406 and substrate structure 400 are washed to remove impurities and uncured second color component C2. This does not wash out the cured second color component C2 in color well 412.

In one other embodiment, the second color component C2 in color well 412 is cured by applying an ultraviolet light from the other side, i.e., the side opposing the first side, of multilevel structure 406. In other embodiments, the second color component C2 in color well 412 is thermally cured by applying heat.

FIG. 5L is a diagram illustrating one embodiment of first color component C1 and second color component C2 and multilevel structure 406 after multilevel structure 406 has been etched away to expose third block 402c. Multilevel structure 406 is etched away to uncover third block 402c, which reduces the thickness T of multilevel structure 406. First color component C1 and second color component C2 are substantially planar with multilevel structure 406 at 424. In one embodiment, this etch is a dry etch. In one embodiment, this etch is a plasma dry etch. In one embodiment, this etch includes at least one of fluorine gas and oxygen.

FIG. 5M is a diagram illustrating one embodiment of multilevel structure 406 and block pattern 402 after third block 402c has been etched away. Third block 402c is etched away to provide color well 414.

During this etch, any residual layer or residual material of third block 402c and/or multilevel structure 406 in color well 414 is etched away. After this etch, the floor 426 of color well 414 is substrate structure 400. In one embodiment, this etch is a dry etch. In one embodiment, this etch is a plasma dry etch. In one embodiment, this etch includes at least one of fluorine gas and oxygen. In one embodiment, this etch is a wet etch. In one embodiment, this etch is a wet etch including PRX. In one embodiment, this etch is a wet etch including solvation. In other embodiments, first color component C1 and second color component C2 etch faster than multilevel structure 406, such that first color component C1 is recessed in color well 410 and second color component C2 is recessed in color well 412 with respect to multilevel structure 406 at 424.

FIG. 5N is a diagram illustrating one embodiment of color well 414 filled with a third color component C3 that is different than the first color component C1 and the second color component C2. The third color component C3 is a single color, such as red, green, blue, white, cyan, yellow, magenta, or another suitable color. As color well 414 is filled, a slight underfill or doctor blade may be used to avoid smearing on multilevel structure 406. In one embodiment, the third color component C3 is applied in a slot-die process. In one embodiment, the third color component C3 is applied in a gravure process. In one embodiment, the third color component C3 is a negative tone color filter dye.

FIG. 5O is a diagram illustrating the third color component C3 in color well 414 being cured. An ultraviolet light is applied through substrate structure 400 to a first side of multilevel structure 406 and into third color component C3 in color well 414. This cures the third color component C3 in color well 414. The cured first color component C1 and the cured second color component C2 block the ultraviolet light and prevent any residual third color component C3 on the first color component C1 and/or the second color component C2 from being cured. In other embodiments, cured first color component C1 and cured second color component C2 do not block the ultraviolet light and care is taken to prevent residual third color component C3 from being on cured first color component C1 and/or cured second color component C2 or it is removed prior to curing.

In one embodiment, multilevel structure 406 is opaque to ultraviolet light, such that multilevel structure 406 blocks the ultraviolet light and prevents the ultraviolet light from curing any of the third color component C3 that may be left on multilevel structure 406 after filling color well 414. This reduces overcoat and smearing problems.

In one embodiment, after curing the third color component C3 in color well 414, multilevel structure 406 and substrate structure 400 are washed to remove impurities and uncured third color component C3. This does not wash out the cured third color component C3 in color well 414.

In one other embodiment, the third color component C3 in color well 414 is cured by applying an ultraviolet light from the other side, i.e., the side opposing the first side, of multilevel structure 406. In other embodiments, the third color component C3 in color well 414 is thermally cured by applying heat.

FIG. 5P is a diagram illustrating one embodiment of a color filter array 428 that is similar to color filter array 20 of FIG. 1. Color filter array 428 includes multilevel structure 406 and substrate structure 400. Multilevel structure 406 includes ribs 408a-408d that define color wells 410, 412, and 414 in multilevel structure 406. The ribs 408a-408d are the side walls of color wells 410, 412, and 414. Substrate structure 400 is the floor of each of the color wells 410, 412, and 414. Multilevel structure 406, including ribs 408a-408d, has a bottom side 430 and a top side 424. The bottom side 430, which is the bottom side 430 of each of the ribs 408a-408d, is attached to substrate structure 400. The top side 424, which is the top side 424 of each of the ribs 408a-408d, is unattached. Also, the top side 424 of each of the ribs 408a-408d is planar. Each of the color wells 410, 412, and 414 is rectangular and has a depth D. In one embodiment, color filter array 428 includes color wells 410, 412, and 414 in a matrix of color wells. In one embodiment, color filter array 428 includes color wells 410, 412, and 414 in a matrix of color wells, where each of the color wells is a sub-pixel and a group of color wells make-up a pixel in a display.

Color wells 410, 412, and 414 are filled with color components that are cured. Each of the color wells 410, 412, and 414 is filled with a single color, such as red, green, blue, white, cyan, yellow, magenta, or another suitable color. First color well 410 is filled with a first color component C1, second color well 412 is filled with a second color component C2, and third color well 414 is filled with a third color component C3. The color component in each of the color wells 410, 412, and 414 is planar with the top side 424 of the ribs 408a-408d. Light is passed through one of the color wells 410, 412, and 414 to display the selected color. In other embodiments, the color component in each of the color wells 410, 412, and 414 is below or recessed from and not planar with the top side 424 of the ribs 408a-408d.

In one embodiment, an opaque layer is applied to one side of color filter array 428 to provide a black matrix between color wells 410, 412, and 414.

Color filter array 428 is manufactured in a roll-to-roll process that reduces cost and provides high resolution and high speed manufacturability. Color filter array 428 can be used in display technologies, such as LCD, OLED, and electrophoretic display technologies.

FIGS. 6A-6E are diagrams illustrating a method of imprinting a multilevel structure 506 on a substrate structure 500. Multilevel structure 506 is similar to multilevel structures 106, 206, 306, and 406. In one embodiment, multilevel structure 506 is imprinted on substrate structure 500 in a roll-to-roll process that includes a flexible press.

Figure 6A:
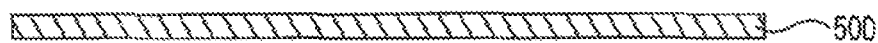
FIGS. 6A-6E are diagrams illustrating a method of imprinting a multilevel structure on a substrate structure.

FIG. 6A is a diagram illustrating one embodiment of a substrate structure 500. In one embodiment, substrate structure 500 is similar to substrate structure 24 (shown in FIG. 1). In one embodiment, substrate structure 500 is transparent to at least ultraviolet light. In one embodiment, substrate structure 500 is a polymer substrate. In other embodiments, substrate structure 500 is opaque.

Figure 6B:
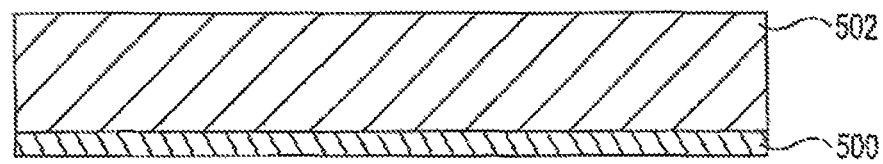

FIG. 6B is a diagram illustrating one embodiment of substrate structure 500 coated with a liquid polymer 502. In one embodiment, liquid polymer 502 is applied in a reverse gravure process. In one embodiment, liquid polymer 502 is applied in a slot-die process.

Figure 6C:
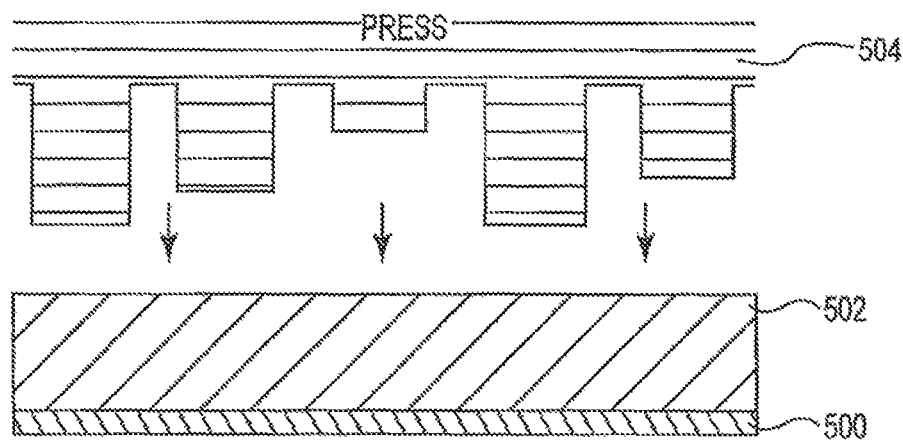

FIG. 6C is a diagram illustrating one embodiment of a press 504 applied to liquid polymer 502. Press 504 includes three dimensional structures that correspond to color wells in multilevel structure 506. Press 504 is pressed into liquid polymer 502, which conforms to the three dimensional structures of the press. In one embodiment, press 504 is a flexible press. In one embodiment, press 504 is transparent to at least ultraviolet light. In one embodiment, press 504 is a rubber stamp.

Figure 6D:
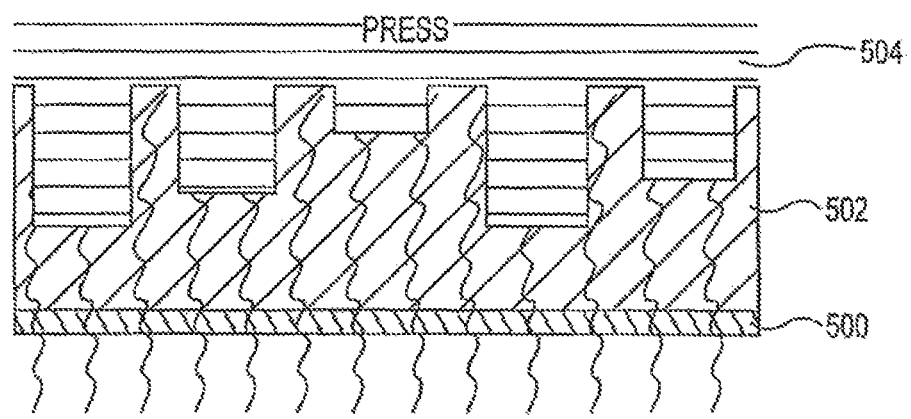

FIG. 6D is a diagram illustrating one embodiment of liquid polymer 502 being cured. An ultraviolet light is shined through substrate structure 500 and into liquid polymer 502 to cure liquid polymer 502. This fixes the liquid polymer 502 into the shape provided by press 504.

Figure 6E:
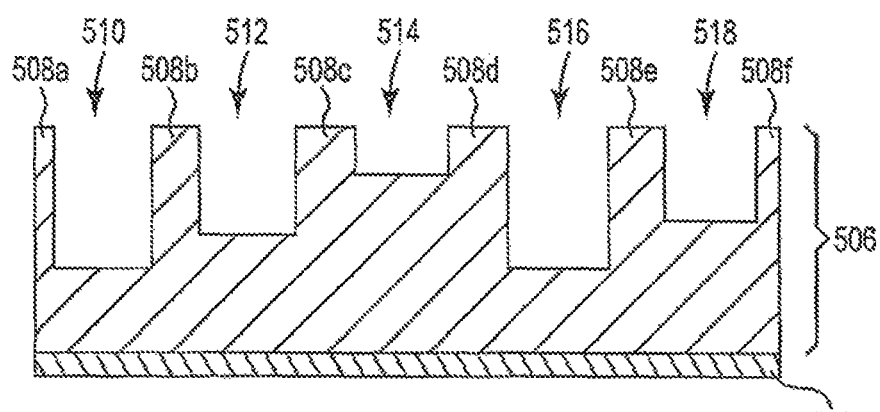

FIG. 6E is a diagram illustrating one embodiment of multilevel structure 506 and substrate structure 500. Multilevel structure 506 is the cured liquid polymer 502. Multilevel structure 506 includes ribs 508a-508f that define color wells 510, 512, 514, 516, and 518. The ribs 508a-508f are side walls of color wells 510, 512, 514, 516, and 518.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A color filter array comprising:
a structure having a top side and a bottom side and including ribs that define first wells and second wells in the structure, wherein a top side of each rib is planar;
a first color component in the first wells and substantially planar with the top side of the structure;
a second color component in the second wells and substantially planar with the top side of the structure; and
a blocking layer, wherein the ribs are formed over the blocking layer, and the blocking layer is visible through the ribs, and wherein the blocking layer is attached to the bottom side of the structure, and the top side of the structure is opposite the bottom side, wherein the first and second wells are defined by the ribs and the blocking layer.

2. The color filter array according to claim 1, further comprising a substrate.

3. The color filter array according to claim 2, wherein the blocking layer is formed over the substrate.

4. The color filter array according to claim 2, wherein the blocking layer is located between the substrate and the ribs.

5. A color filter array comprising:
a structure having a top side and a bottom side and including ribs that define first wells and second wells in the structure, wherein a top side of each rib is planar;
a first color component in the first wells and substantially planar with the top side of the structure;

a second color component in the second wells and substantially planar with the top side of the structure; and a blocking layer, wherein the ribs are formed over the blocking layer, and the blocking layer is visible through the ribs, and wherein the blocking layer is attached to the bottom side of the structure, and the top side of the structure is opposite the bottom side, wherein a substrate defines a floor of the first and second wells.

6. The color filter array according to claim 1, wherein the blocking layer is opaque.

7. The color filter array according to claim 1, wherein the blocking layer provides black lines between the first color component and the second color component.

8. The color filter array according to claim 1, wherein the blocking layer includes at least one of the following: a metal, a polymer including carbon black, and an oxide that scatters light.

9. A color filter array comprising:
a structure having a top side and a bottom side and including ribs that define first wells and second wells in the structure, wherein a top side of each rib is planar;
a first color component in the first wells and substantially planar with the top side of the structure;
a second color component in the second wells and substantially planar with the top side of the structure; and
a substrate structure including a first conductive layer, a second conductive layer, and a dielectric layer disposed between the first conductive layer and the second conductive layer, wherein the first conductive layer, the second conductive layer and the dielectric layer are arranged on a same side of the color filter array, and wherein a bottom side of each of the ribs is attached to the second conductive layer, and wherein the second conductive layer is transparent to visible light.

10. The color filter array according to claim 9, wherein the first wells and the second wells are defined by the ribs and the second conductive layer.

11. The color filter array according to claim 9, wherein the dielectric layer defines a floor of the first wells and the second wells.

12. The color filter array according to claim 9, wherein the substrate structure is transparent.

13. The color filter array according to claim 9, further comprising an opaque layer that provides black lines between the first color component and the second color component.

14. The color filter array according to claim 9, wherein the substrate structure provides black lines between the first color component and the second color component.

15. A color filter array comprising:
a well structure having a top side and a bottom side and including ribs that define first wells and second wells in the well structure, wherein a top side of each rib is planar;
a first color component in the first wells and substantially planar with the top side of the well structure;
a second color component in the second wells and substantially planar with the top side of the well structure;
an opaque layer that provides black lines between the first color component and the second color component, the opaque layer providing a black matrix visible through the ribs; and
a substrate structure attached to the bottom side of the well structure, and the top side of the well structure is opposite the bottom side.

* * * * *